(12) United States Patent
Chung et al.

(10) Patent No.: US 7,528,631 B2
(45) Date of Patent: May 5, 2009

(54) LOGIC GATE, SCAN DRIVER AND ORGANIC LIGHT EMITTING DIODE DISPLAY USING THE SAME

(75) Inventors: Bo Yong Chung, Yongin-si (KR); Wang Jo Lee, Yongin-si (KR); Hyung Soo Kim, Yongin-si (KR); Sang Moo Choi, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/826,321

(22) Filed: Jul. 13, 2007

(65) Prior Publication Data

US 2008/0036497 A1  Feb. 14, 2008

(30) Foreign Application Priority Data

Aug. 8, 2006  (KR) .................. 10-2006-0074586

(51) Int. Cl.
*H03K 19/20* (2006.01)
(52) U.S. Cl. .................... 326/119; 326/106; 345/76; 345/205
(58) Field of Classification Search ........... 326/102, 326/104–108, 119, 121; 377/64, 73–76; 345/55, 82–83, 87–104, 204–205
See application file for complete search history.

(56) References Cited

U.S. PATENT DOCUMENTS 5,311,479 A  5/1994  Harada
5,517,133 A * 5/1996  Sandhu .................. 326/121
5,694,061 A  12/1997  Morosawa et al.
6,300,801 B1  10/2001  Jin
2004/0164978 A1 * 8/2004  Shin et al. .............. 345/211
2007/0040786 A1 * 2/2007  Chung .................... 345/92

FOREIGN PATENT DOCUMENTS

| JP | 05-048465 | 2/1993 |
| JP | 05-095276 | 4/1993 |
| JP | 05-300007 | 11/1993 |
| JP | 08-032441 | 11/2001 |
| KR | 10-1991-0021050 | 12/1991 |
| KR | 10-1997-0008886 | 2/1997 |
| KR | 10-2000-0021373 | 4/2000 |
| KR | 10-0314732 B1 | 11/2001 |

* cited by examiner

*Primary Examiner*—Rexford Barnie
*Assistant Examiner*—Jany Tran
(74) *Attorney, Agent, or Firm*—Lee & Morse, P.C.

(57) ABSTRACT

A logic gate includes a first driver to receive an input signal, and to control a connection between a first power source and a first node in correspondence with the input signal, a second driver coupled to the first node and a second power source, and to control a voltage of the first node, a third driver to control a connection between an output terminal and the first power source in correspondence with the voltage of the first node, a control transistor to control a connection between the third driver and the second power source, a fourth driver to control a connection between a gate electrode of the control transistor and the second power source, and a second capacitor between a first electrode of the control transistor and the gate electrode of the control transistor, wherein the transistors are a same type of MOS transistor.

26 Claims, 10 Drawing Sheets

LOGIC GATE, SCAN DRIVER AND ORGANIC LIGHT EMITTING DIODE DISPLAY USING THE SAME

CROSS-REFERENCE TO RELATED APPLICATION

This application is related to U.S. patent application Ser. No. 11/826,315, entitled "LOGIC GATE, SCAN DRIVER AND ORGANIC LIGHT EMITTING DIODE DISPLAY USING THE SAME," which was filed on Jul. 13, 2007.

BACKGROUND OF THE INVENTION

1. Field of the Invention

Embodiments of the present invention relate to a logic gate, a scan driver and an organic light emitting diode display using the same. More particularly, embodiments of the present invention relate to a logic gate that may be realized using PMOS transistors, and a scan driver and an organic light emitting diode (OLED) display using the same.

2. Description of the Related Art

Recently, various flat panel displays exhibiting reduced weight and volume, which are disadvantages of cathode ray tubes (CRTs), have been developed. Flat panel displays include, e.g., liquid crystal displays (LCDs), field emission displays (FEDs), plasma display panels (PDPs), and OLED displays.

The OLED display makes use of organic light emitting diodes that emit light by re-combination of electrons and holes. The OLED display has advantages of high response speed and low power consumption.

The OLED display may include pixels, a data driver and a scan driver. The pixels may be arranged in a matrix. The data driver may drive data lines that are coupled to the pixels, and the scan driver may drive scan lines that are also coupled to the pixels.

The data driver may provide a data signal corresponding to data every horizontal time period, thereby causing the pixels to display a predetermined image. The scan driver may provide a scan signal every horizontal time period to select pixels to which the data signal is provided.

As a size of OLED display is increased, it may be desirable to form the scan driver on the OLED panel in order to reduce the size, weight and manufacturing cost thereof. However, because a conventional scan driver includes PMOS transistors and NMOS transistors, it is difficult to form such a scan driver on the panel. Accordingly, there is a demand for a scan driver that is formed of a single type of MOS transistor.

SUMMARY OF THE INVENTION

The present invention is therefore directed to a logic gate, a scan driver and an organic light emitting diode display using the same, which substantially overcome one or more of the problems due to the limitations and disadvantages of the related art.

It is therefore a feature of an embodiment of the present invention to provide a logic gate suitable for incorporation into a display panel and including one type of transistor.

It is therefore another feature of an embodiment of the present invention to provide a scan driver having logic gates that include one type of transistor.

It is therefore a further feature of an embodiment of the present invention to provide a display that includes pixel circuits and scan driver logic gates that are part of a same panel.

At least one of the above and other features and advantages of the present invention may be realized by providing a logic gate, including a first driver configured to receive at least one input signal, and configured to control a connection between a first power source and a first node of the logic gate in correspondence with the at least one input signal, a second driver coupled to the first node and a second power source, and configured to control a voltage of the first node, a third driver configured to control a connection between an output terminal and the first power source in correspondence with the voltage of the first node, a control transistor configured to control a connection between the third driver and the second power source, a fourth driver configured to control a connection between a gate electrode of the control transistor and the second power source, and a second capacitor coupled between a first electrode of the control transistor and the gate electrode of the control transistor, wherein the control transistor and all transistors in the first driver, the second driver, the third driver and the fourth driver are a same type of MOS transistor.

The control transistor and the transistors in the first driver, the second driver, the third driver, and the fourth driver may be PMOS transistors. The first driver may include a plurality of transistors coupled in series between the first power source and the first node, and the transistors may be configured to operate in correspondence with a plurality of input signals. The first driver may include a first transistor configured to operate in correspondence with a first input signal, a second transistor configured to operate in correspondence with a second input signal, and a third transistor configured to operate in correspondence with a third input signal.

The second driver may be configured to maintain the first node at a voltage of the first power source when the first driver connects the first power source to the first node, and the second driver may be configured to maintain the first node at a voltage of the second power source at other times. The second driver may include a fourth transistor configured to control a connection between the first node and the second power source, a fifth transistor having a first electrode coupled to a gate electrode of the fourth transistor, and having a second electrode and gate electrode coupled to the second power source, and a first capacitor coupled between a first electrode and the gate electrode of the fourth transistor. A length/width ratio of the fourth transistor may be set to a narrower range than that of the first transistor, the second transistor, and the third transistor. The second driver may include a fourth transistor configured to control a connection between the first node and the second power source, a first capacitor coupled between a first electrode and a gate electrode of the fourth transistor, a twentieth transistor, a twenty-first transistor and a twenty-second transistor, wherein the twentieth, twenty-first, and twenty-second transistors may be coupled in series between the first electrode and the gate electrode of the fourth transistor, and may be configured to operate in correspondence with a plurality of input signals, and a twenty-third transistor, a twenty-fourth transistor and a twenty-fifth transistor, wherein the twenty-third, twenty-fourth, and twenty-fifth transistors may be coupled in parallel between the gate electrode of the fourth transistor and the second power source, and may be configured to operate in correspondence with a plurality of input bar signals.

The third driver may include a sixth transistor configured to control a connection between the first power source and the first electrode of the control transistor in correspondence with the voltage of the first node. The third driver may further include a seventh transistor configured to control a connection between the first electrode and the gate electrode of the control transistor in correspondence with the voltage of the first node. The third driver may include a thirtieth transistor, a thirty-first transistor, a thirty-second transistor, and a thirty-third transistor, the thirtieth transistor may be configured to control a connection between the first power source and the fourth driver in correspondence with the voltage of the first node, the thirty-first transistor may be configured to control a connection between the first power source and the thirty-third transistor, and may have a gate electrode coupled to a second electrode of the thirtieth transistor, the thirty-third transistor may be configured to control a connection between the thirty-first transistor and the second power source in correspondence with the voltage of the first node, and the thirty-second transistor may be configured to control a connection between the control transistor and the first power source, and may have a gate electrode coupled to a second electrode of the thirty-first transistor. The gate electrode of the control transistor may be coupled to the second electrode of the thirtieth transistor.

The fourth driver may include a plurality of transistors coupled in series between the gate electrode of the control transistor and the second power source, and the transistors may be configured to operate in correspondence with a plurality of input signals. The fourth driver may include a ninth transistor configured to operate in correspondence with a first input signal, a tenth transistor configured to operate in correspondence with a second input signal, and an eleventh transistor configured to operate in correspondence with a third input signal. The fourth driver may include a ninth transistor having a first electrode coupled to the gate electrode of the control transistor, and may have a second electrode and a gate electrode coupled to the second power source. A length/width ratio of the control transistor may be set to a narrower range than that of at least one transistor included in the third driver.

At least one of the above and other features and advantages of the present invention may also be realized by providing a scan driver, including at least one decoder having a plurality of first OR gates configured to provide a plurality of first signals, and a plurality of second OR gates configured to carry out an OR operation on the first signals and to provide a plurality of scan signals, wherein all transistors in each of the first OR gates and the second OR gates are a same type of MOS transistor.

Transistors in each of the first OR gates and the second OR gates may be PMOS transistors. The at least one decoder may be configured to receive at least one externally-supplied signal out of driving signals and driving bar signals, and the driving signals and driving bar signals may be set to a longer period of a HIGH polarity than that of a LOW polarity. Each first OR gate and each second OR gate may include a first driver configured to receive at least one input signal, and configured to control a connection between a first power source and a first node of the logic gate in correspondence with the at least one input signal, a second driver coupled to the first node and a second power source, and configured to control a voltage of the first node, a third driver configured to control a connection between an output terminal and the first power source in correspondence with the voltage of the first node, a control transistor configured to control a connection between the third driver and the second power source, a fourth driver configured to control a connection between a gate electrode of the control transistor and the second power source, and a second capacitor coupled between a first electrode of the control transistor and the gate electrode of the control transistor, wherein the control transistor and all transistors in the first driver, the second driver, the third driver and the fourth driver are the same type of MOS transistor.

At least one of the above and other features and advantages of the present invention may further be realized by providing an organic light emitting diode display, including pixel circuits coupled to respective data lines and scan lines, a data driver configured to supply data signals to the data lines, and a scan driver configured to provide scan signals to the scan lines, wherein the scan driver includes at least one decoder having a plurality of first OR gates configured to provide a plurality of first signals, and a plurality of second OR gates configured to carry out an OR operation on the first signals and to provide a plurality of scan signals, wherein all transistors in each of the first OR gates and the second OR gates are a same type of MOS transistor.

The pixel circuits may each include at least one transistor, and the second OR gates and the pixel circuits may be part of a same panel. The first OR gates and the data driver may be part of a same chip. The scan driver may include PMOS transistors, and the PMOS transistors in the scan driver may be formed at the same time as the transistors in the pixel circuits. The at least one decoder may be configured to receive at least one externally-supplied signal out of driving signals and driving bar signals, and the driving signals and driving bar signals may be set to a longer period of a HIGH polarity than that of a LOW polarity.

Each first OR gate and each second OR gate may include a first driver configured to receive at least one input signal, and configured to control a connection between a first power source and a first node of the logic gate in correspondence with the at least one input signal, a second driver coupled to the first node and a second power source, and configured to control a voltage of the first node, a third driver configured to control a connection between an output terminal and the first power source in correspondence with the voltage of the first node, a control transistor configured to control a connection between the third driver and the second power source, a fourth driver configured to control a connection between a gate electrode of the control transistor and the second power source, and a second capacitor coupled between a first electrode of the control transistor and the gate electrode of the control transistor, wherein the control transistor and all transistors in the first driver, the second driver, the third driver and the fourth driver may be the same type of MOS transistor.

The first driver may include a plurality of transistors coupled in series between the first power source and the first node, and the transistors may be configured to operate in correspondence with a plurality of input signals. The second driver may be configured to maintain the first node at a voltage of the first power source when the first driver connects the first power source to the first node, and the second driver may be configured to maintain the first node at a voltage of the second power source at other times. The third driver may be configured to control a connection between the first power source and the first electrode of the control transistor in correspondence with the voltage of the first node. The fourth driver may include a plurality of transistors coupled between the gate electrode of the control transistor and the second power source, and the transistors may be configured to operate in correspondence with a plurality of input signals. The display may include a plurality of decoders, the display may be configured to provide a plurality of input signals to the decoders, the input signals may have different frequencies, and a decoder receiving a higher frequency input signal may be disposed closer to the second OR gates than a decoder receiving a lower frequency input signal.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
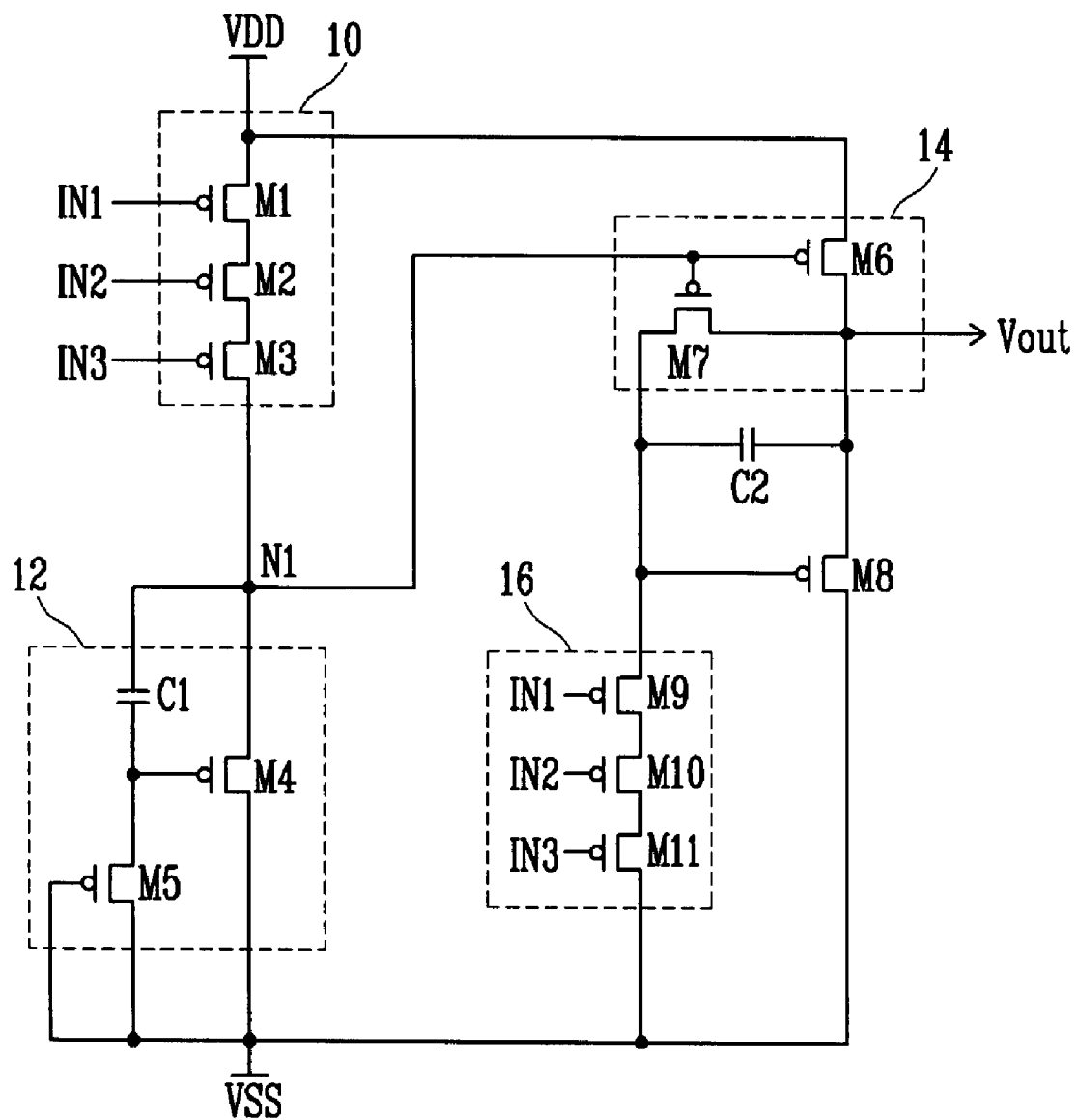
FIG. 1 illustrates a circuit view of an OR gate according to a first embodiment of the present invention.

Korean Patent Application No. 10-2006-0074586, filed on Aug. 8, 2006, in the Korean Intellectual Property Office, and entitled: "Logic Gate, Scan Driver and Organic Light Emitting Diode Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

Where an element is described as being coupled to a second element, the element may be directly coupled to second element, or may be indirectly coupled to second element via one or more other elements. Further, where an element is described as being coupled to a second element, it will be understood that the elements may be electrically coupled, e.g., in the case of transistors, capacitors, power supplies, nodes, etc. In the drawings, elements may be omitted for clarity. Like reference numerals refer to like elements throughout.

Embodiments of the present invention will now be described wherein transistors in particular circuits are all PMOS transistors. For these circuits, as used herein, the polarity of the first power source (VDD) is a HIGH polarity, and the polarity of a second power source (VSS) is a LOW polarity, i.e., a voltage of the second power source (VSS) is lower than a voltage of the first power source (VDD).

FIG. 1 illustrates a circuit view of an OR gate according to a first embodiment of the present invention. The OR gate according to the first embodiment of the present invention may be realized using transistors that are all a same type of MOS transistor, e.g., all PMOS transistors.

Referring to FIG. 1, the OR gate may include an eighth transistor (M8) (a control transistor) for controlling a voltage supplied to an output terminal (Vout); a first driver 10 arranged between a first power source (VDD) and a first node (N1) and controlling the connection of the first node (N1) to the first power source (VDD) to correspond to polarities (HIGH or LOW) of a first input signal (IN1), a second input signal (IN2) and a third input signal (IN3); a second driver 12 arranged between the first node (N1) and a second power source (VSS) to control a voltage of the first node (N1); a third driver 14 coupled between a first electrode of the eighth transistor (M8) and the first power source (VDD) and controlling the connection of the first power source (VDD) to the first electrode of the eighth transistor (M8) to correspond to the voltage of the first node (N1); and a fourth driver 16 coupled between a gate electrode of the eighth transistor (M8) and the second power source (VSS) and controlling the connection of the second power source (VSS) to the gate electrode of the eighth transistor (M8) to correspond to polarities (HIGH or LOW) of the first input signal (IN1), the second input signal (IN2) and the third input signal (IN3).

The eighth transistor (M8) may control a voltage supplied to the output terminal (Vout) while being turned on or turned off by a voltage supplied to its gate electrode. For example, the eighth transistor (M8) may be turned off when the voltage of the first power source (VDD) is supplied to its gate electrode, and may be turned on when the voltage of the second power source (VSS) is supplied to its gate electrode.

The first driver 10 may include a first transistor (M1), a second transistor (M2) and a third transistor (M3), which may be coupled in series between the first power source (VDD) and the first node (N1). In the first driver 10, the first power source (VDD) and the first node (N1) may be coupled to each other when the first input signal (IN1), the second input signal (IN2) and the third input signal (IN3) all have a LOW polarity. More specifically, the first transistor (M1) may be turned on when a first input signal (IN1) has a LOW polarity, the second transistor (M2) may be turned on when a second input signal (IN2) has a LOW polarity, and the third transistor (M3) may be turned on when a third input signal (IN3) has a LOW polarity. Thus, since the first transistor (M1), the second transistor (M2) and the third transistor (M3) are coupled in series between the first power source (VDD) and the first node (N1), the first power source (VDD) and the first node (N1) may be coupled to each other when each of the first input signal (IN1), the second input signal (IN2), and the third input signal (IN3) has a LOW polarity.

The second driver 12 may include a fourth transistor (M4) coupled between the first node (N1) and the second power source (VSS); a fifth transistor (M5) coupled between a gate electrode of the fourth transistor (M4) and the second power source (VSS); and a first capacitor (C1) coupled between the gate electrode of the fourth transistor (M4) and a first electrode of the fourth transistor (M4).

The second driver 12 may maintain the voltage of the first power source (VDD) when the voltage of the first power source (VDD) is supplied to the first node (N1), and maintain a voltage of the first node (N1) at the voltage of the second power source (VSS) otherwise. More specifically, a first electrode of the fifth transistor (M5) may be coupled to the gate electrode of the fourth transistor (M4), and a gate electrode and a second electrode of the fifth transistor (M5) may be coupled to the second power source (VSS). Thus, the fifth transistor (M5) may be coupled as a diode to maintain a voltage of the gate electrode of the fourth transistor (M4) generally at the voltage of the second power source (VSS).

When the first power source (VDD) and the first node (N1) are electrically decoupled by the first driver 10, the fourth transistor (M4) may maintain a voltage of the first node (N1) at a LOW polarity. When the first power source (VDD) and the first node (N1) are electrically coupled to each other by the first driver 10, the fourth transistor (M4) may maintain a voltage of the first node (N1) at a HIGH polarity. A width/length ratio (W/L) of the fourth transistor (M4) may be set to a narrower range than a width/length ratio (W/L) of each of the first transistor (M1), the second transistor (M2) and the third transistor (M3). The voltage of the first power source (VDD) may be stably maintained when the voltage of the first power source (VDD) is supplied to the first node (N1). The first capacitor (C1) may charge a voltage between a first electrode and a gate electrode of the fourth transistor (M4), which may stabilize operation of the fourth transistor (M4).

A leakage current may be caused by the fourth transistor (M4) when a voltage of the first power source (VDD) is supplied to the first node (N1). When the first power source (VDD) is supplied to the first node (N1), all of the first input signal (IN1), the second input signal (IN2) and the third input signal (IN3) have a LOW polarity. However, as the LOW polarity periods of these input signals may be extremely short during operation of the system, the leakage current may not result in a large power consumption.

The third driver 14 may include a sixth transistor (M6) between the first power source (VDD) and the first electrode of the eighth transistor (M8). The third driver 14 may further include a seventh transistor (M7) coupled between a gate electrode and a second electrode of a sixth transistor (M6).

The third driver 14 may control the connection of the first electrode of the eighth transistor (M8) to the first power source (VDD) in correspondence with the voltage supplied to the first node (N1). More specifically, the sixth transistor (M6) and the seventh transistor (M7) may be turned on when a voltage of the LOW polarity is supplied to the first node (N1), and turned off otherwise. When the sixth transistor (M6) is turned on, the voltage of the first power source (VDD) may be supplied to the output terminal (Vout). When the seventh transistor (M7) is turned on, the first electrode and the gate electrode of the eighth transistor (M8) may be electrically coupled to each other. Thus, when the seventh transistor (M7) is turned on, the first power source (VDD) may be supplied to the gate electrode of the eighth transistor (M8) and the eighth transistor (M8) may be turned off. A second capacitor (C2) may be coupled between the first electrode and the gate electrode of the eighth transistor (M8), and may charge a voltage between the first electrode and the gate electrode of the eighth transistor (M8), which may prevent a leakage current from being generated from the eighth transistor (M8).

The fourth driver 16 may include a ninth transistor (M9), a tenth transistor (M10) and an eleventh transistor (M11), which may be coupled in series between the gate electrode of the eighth transistor (M8) and the second power source (VSS).

In the fourth driver 16, the gate electrode of the eighth transistor (M8) and the second power source (VSS) may be electrically coupled to each other when the first input signal (IN1), the second input signal (IN2) and the third input signal (IN3) all have a LOW polarity. More specifically, the ninth transistor (M9) may be turned on when the first input signal (IN1) has a LOW polarity, the tenth transistor (M10) may be turned on when the second input signal (IN2) has a LOW polarity, and the eleventh transistor (M11) may be turned on when the third input signal (IN3) has a LOW polarity. Since the ninth transistor (M9), the tenth transistor (M10) and the eleventh transistor (M11) may be coupled in series between the gate electrode of the eighth transistor (M8) and the second power source (VSS), the gate electrode of the eighth transistor (M8) and the second power source (VSS) may be electrically coupled to each other when each of the first input signal (IN1), the second input signal (IN2) and the third input signal (IN3) has a LOW polarity.

Table 1 represents a Truth Table of an OR gate according to an embodiment of the present invention.

TABLE 1

| IN1 | IN2 | IN3 | Vout |
|-----|-----|-----|------|
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 1 |

An operation of the OR gate will now be described in detail with reference to FIG. 1 and Table 1.

Any one of the first transistor (M1), the second transistor (M2) and the third transistor (M3) may be turned off when a corresponding one of the first input signal (IN1), the second input signal (IN2), and the third input signal (IN3) is at a HIGH polarity, in which case the first power source (VDD) and the first node (N1) may be electrically decoupled, and a voltage of the first node (N1) may be generally set to the voltage of the second power source (VSS).

When a voltage of the first node (N1) is at a LOW polarity, the sixth transistor (M6) and the seventh transistor (M7) may be turned on. When the sixth transistor (M6) and the seventh transistor (M7) are turned on, the voltage of the first power source (VDD) may be output to the output terminal (Vout), i.e., a voltage output has a HIGH polarity. Any one of a ninth transistor (M9), a tenth transistor (M10) and an eleventh transistor (M11) may be turned off when a corresponding one of the first input signal (IN1), the second input signal (IN2) and the third input signal (IN3) is at a HIGH polarity, in which case the gate electrode of the eighth transistor (M8) and the second power source (VSS) may be electrically decoupled, and an output voltage at a HIGH polarity may be maintained.

The first transistor (M1), the second transistor (M2) and the third transistor (M3) may each be turned on when the first input signal (IN1), the second input signal (IN2) and the third input signal (IN3) each have a LOW polarity, in which case the first power source (VDD) and the first node (N1) may be electrically coupled to each other, and a voltage of the first node (N1) may be generally set to the voltage of the first power source (VDD).

When a voltage of the first node (N1) is at a HIGH polarity, the sixth transistor (M6) and the seventh transistor (M7) may be turned off. The ninth transistor (M9), the tenth transistor (M10) and the eleventh transistor (M11) may each be turned on when the first input signal (IN1), the second input signal (IN2), and the third input signal (IN3) each have a LOW polarity, in which case the eighth transistor (M8) may be turned on when the voltage of the second power source (VSS) is supplied to a gate electrode of the eighth transistor (M8), and a voltage having a LOW polarity may be output to the output terminal (Vout).

As described above, the OR gates according to the first embodiment of the present invention may use transistors that are entirely a same type of MOS transistor, e.g., all PMOS transistors. Accordingly, the OR gates may be formed on a panel of the organic light emitting diode display, and therefore manufacturing costs may be lowered and the manufacturing process may be simplified.

It will be appreciated that, although OR gates having three inputs are shown in FIG. 1, the present invention is not limited thereto. The number of the inputs may be varied by varying the number of transistors included in each of the first driver 10 and the fourth driver 16. For example, four transistors may be provided in each of the first driver 10 and the fourth driver 16 so as to form an OR gate having four inputs.

Figure 2:
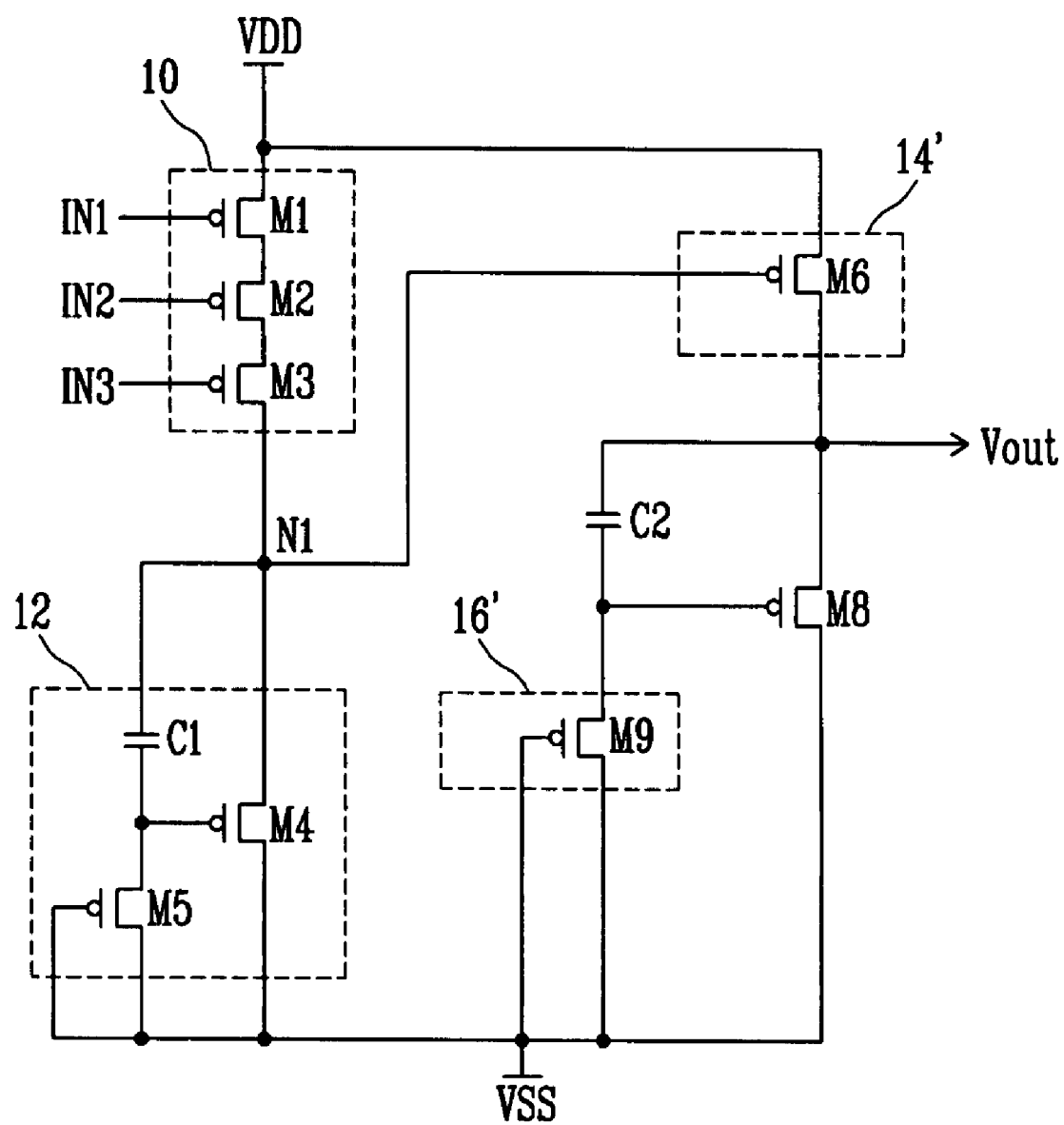
FIG. 2 illustrates a circuit view of an OR gate according to a second embodiment of the present invention.

FIG. 2 illustrates a circuit view of an OR gate according to a second embodiment of the present invention. The following description will focus on elements that are different from those described above in connection with the first embodiment and, in order to avoid repetition, a detailed explanation of the features described above will not be repeated.

Referring to FIG. 2, the OR gate according to the second embodiment of the present invention may include the first driver 10, the second driver 12, a third driver (14'), a fourth driver (16'), and the eighth transistor (M8) (control transistor). The first driver 10 and the second driver 12 may be configured and driven in the same manner as described above in connection with FIG. 1.

The third driver (14') may include the sixth transistor (M6) coupled between the first power source (VDD) and the first electrode of the eighth transistor (M8). The sixth transistor (M6) may control the connection between the first power source (VDD) and the first electrode of the eighth transistor (M8) in correspondence with a voltage applied to the first node (N1). When a voltage having a LOW polarity is supplied to the first node (N1), the sixth transistor (M6) may be turned on and may electrically connect the first electrode of the eighth transistor (M8 to the first power source (VDD). The sixth transistor (M6) may be turned off and may electrically interrupt the first power source (VDD) and the first electrode of the eighth transistor (M8) otherwise.

The fourth driver (16') may include the ninth transistor (M9) coupled between the gate electrode of the eighth transistor (M8) and the second power source (VSS). In particular, the first electrode of the ninth transistor (M9) may be coupled to the gate electrode of the eighth transistor (M8), and a gate electrode and a second electrode of the ninth transistor (M9) may be coupled to the second power source (VSS).

The ninth transistor (M9) may be coupled as a diode to maintain a voltage of the gate electrode of the eighth transistor (M8) generally at the voltage of the second power source (VSS). The eighth transistor (M8) may maintain a voltage of the output terminal (Vout) at a LOW polarity when the sixth transistor (M6) is turned off, and may maintain the voltage of the output terminal (Vout) at a HIGH polarity when the sixth transistor (M6) is turned on. A width/length ratio (W/L) of the eighth transistor (M8) may be set to a narrower range than a width/length ratio (W/L) of the sixth transistor (M6). By setting the width/length ratio (W/L) of the eighth transistor (M8) to a narrower range than the width/length ratio (W/L) of the sixth transistor (M6), the voltage of the first power source (VDD) may be stably maintained when the voltage of the first power source (VDD) is supplied to the output terminal (Vout).

An operation of the OR gate will be now described in detail with reference to FIG. 2 and Table 1.

Any one of the first transistor (M1), the second transistor (M2) and the third transistor (M3) may be turned off when a corresponding one of the first input signal (IN1), the second input signal (IN2) and the third input signal (IN3) is at a HIGH polarity, in which case the first power source (VDD) and the first node (N1) may be electrically decoupled, and a voltage of the first node (N1) may be generally set to the voltage of the second power source (VSS). The sixth transistor (M6) may be turned on when a voltage of the first node (N1) is at a LOW polarity, and the voltage of the first power source (VDD) may be output to the output terminal (Vout) when the sixth transistor (M6) is turned on.

The first transistor (M1), the second transistor (M2) and the third transistor (M3) may each be turned on when the first input signal (IN1), the second input signal (IN2) and the third input signal (IN3) each have a LOW polarity, in which case the first power source (VDD) and the first node (N1) may be electrically coupled to each other, and a voltage of the first node (N1) may be generally set to the voltage of the first power source (VDD). The sixth transistor (M6) may be turned off when a voltage of the first node (N1) has a HIGH polarity, and a voltage of the output terminal (Vout) may be reduced to the voltage of the second power source (VSS) when the sixth transistor (M6) is turned off.

Figure 3:
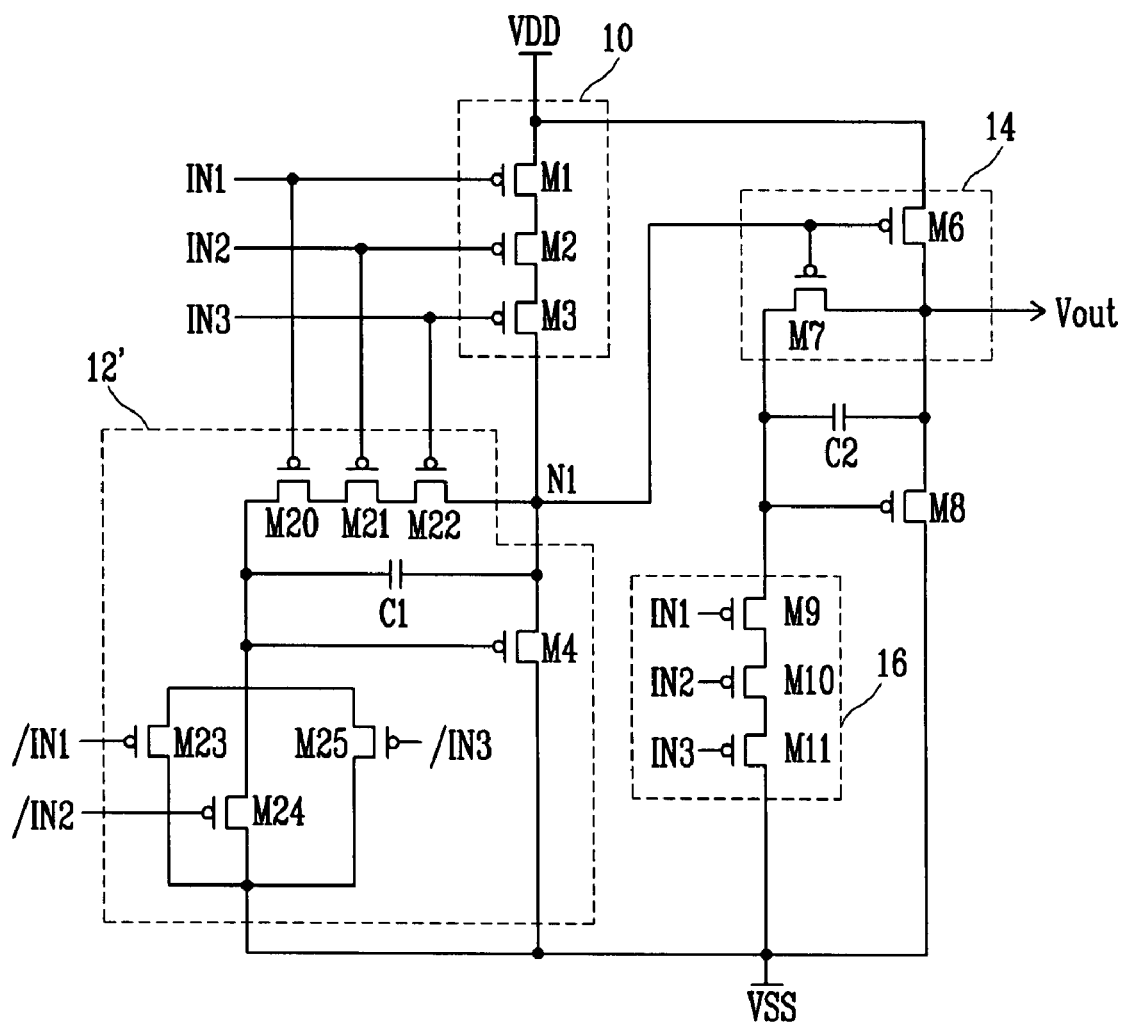
FIG. 3 illustrates a circuit view of an OR gate according to a third embodiment of the present invention.

FIG. 3 illustrates a circuit view of an OR gate according to a third embodiment of the present invention. The following description will focus on elements that are different from those described above in connection with the first embodiment and, in order to avoid repetition, a detailed explanation of the features described above will not be repeated.

Referring to FIG. 3, the OR gate according to the third embodiment of the present invention may include the first driver 10, a second driver (12'), the third driver 14, the fourth driver 16 and the eighth transistor (M8). The first driver 10, the third driver 14, the fourth driver 16 and the eighth transistor (M8) may be configured and driven in the same manner as described above in connection with FIG. 1.

The second driver (12') may include the fourth transistor (M4) coupled between the first node (N1) and the second power source (VSS); a twentieth transistor (M20), a twenty-first transistor (M21) and a twenty-second transistor (M22) coupled in series between the first electrode and the gate electrode of the fourth transistor (M4); the first capacitor (C1) coupled between the first electrode and the gate electrode of the fourth transistor (M4); and a twenty-third transistor (M23), a twenty-fourth transistor (M24) and a twenty-fifth transistor (M25) coupled in parallel between the gate electrode of the fourth transistor (M4) and the second power source (VSS). The second driver (12') may control a voltage of the first node (N1) in correspondence with the input signals (IN1 to IN3) and input bar signals (/IN1 to /IN3).

The twentieth transistor (M20) may be controlled by the first input signal (IN1), the twenty-first transistor (M21) may be controlled by the second input signal (IN2), and the twenty-second transistor (M22) may be controlled by the third input signal (IN3). The twentieth transistor (M20) through the twenty-second transistor (M22) may electrically connect the gate electrode of the fourth transistor (M4) to the first node (N1) when the first input signal (IN1) through the third input signal (IN3) each have a LOW polarity.

The twenty-third transistor (M23) may be controlled by the first input bar signal (/IN1), the twenty-fourth transistor (M24) may be controlled by the second input bar signal (/IN2), and the twenty-fifth transistor (M25) may be controlled by the third input bar signal (/IN3). The twenty-third transistor (M23) to the twenty-fifth transistor (M25) may electrically connect the second power source (VSS) to the gate electrode of the fourth transistor (M4) when any one of the first input bar signal (/IN1) to the third input bar signal (/IN3) has a LOW polarity.

An operation of the OR gate will be described in detail with reference to FIG. 3 and Table 1.

Any one of the first transistor (M1), the second transistor (M2) and the third transistor (M3) may be turned off when a corresponding one of the first input signal (IN1), the second input signal (IN2) and the third input signal (IN3) is at a HIGH polarity. Any one of the twentieth transistor (M20), the twenty-first transistor (M21), and the twenty-second transistor (M22) may be turned off when a corresponding one of the first input signal (IN1), the second input signal (IN2) and the third input signal (IN3) is at a HIGH polarity. Any one of the twenty-third transistor (M23), the twenty-fourth transistor (M24), and the twenty-fifth transistor (M25) may be turned on when a corresponding one of the first input bar signal (/IN1), the second input bar signal (/IN2) and the third input bar signal (/IN3) is at a LOW polarity.

When a voltage at a LOW polarity is supplied to the gate electrode of the fourth transistor (M4), the fourth transistor (M4) may be turned on and a voltage at a LOW polarity may be supplied to the first node (N1). When the voltage of the first node (N1) is at a LOW polarity, the sixth transistor (M6) and the seventh transistor (M7) may be turned on. When the sixth transistor (M6) and the seventh transistor (M7) are turned on, the voltage of the first power source (VDD) may be output to the output terminal (Vout).

The first transistor (M1), the second transistor (M2) and the third transistor (M3) may be turned on when the first input signal (IN1), the second input signal (IN2) and the third input signal (IN3) are at a LOW polarity. The twentieth transistor (M20), the twenty-first transistor (M21) and the twenty-second transistor (M22) may be turned on when the first input signal (IN1), the second input signal (IN2) and the third input signal (IN3) are at a LOW polarity. A voltage of the first node (N1) may be set to a HIGH polarity when the fourth transistor (M4) is turned off.

The twenty-third transistor (M23) to the twenty-fifth transistor (M25) may each be turned off when corresponding ones of the first input bar signal (/IN1) to the third input bar signal (/IN3) each have a HIGH polarity, i.e., when the first input signal (IN1), the second input signal (IN2) and the third input signal (IN3) each have a LOW polarity. Accordingly, the fourth transistor (M4) may be stably maintained in a turned-off state.

The sixth transistor (M6) and the seventh transistor (M7) may be turned off when a voltage of the first node (N1) is at a HIGH polarity. At this time, the voltage of the second power source may be supplied to the gate electrode of the eighth transistor (M8) when the ninth transistor (M9) to the eleventh transistor (M11) are each turned on, and therefore the eighth transistor (M8) may be turned on. When the eighth transistor (M8) is turned on, the voltage of the second power source (VSS) may be supplied to the output terminal (Vout).

Figure 4:
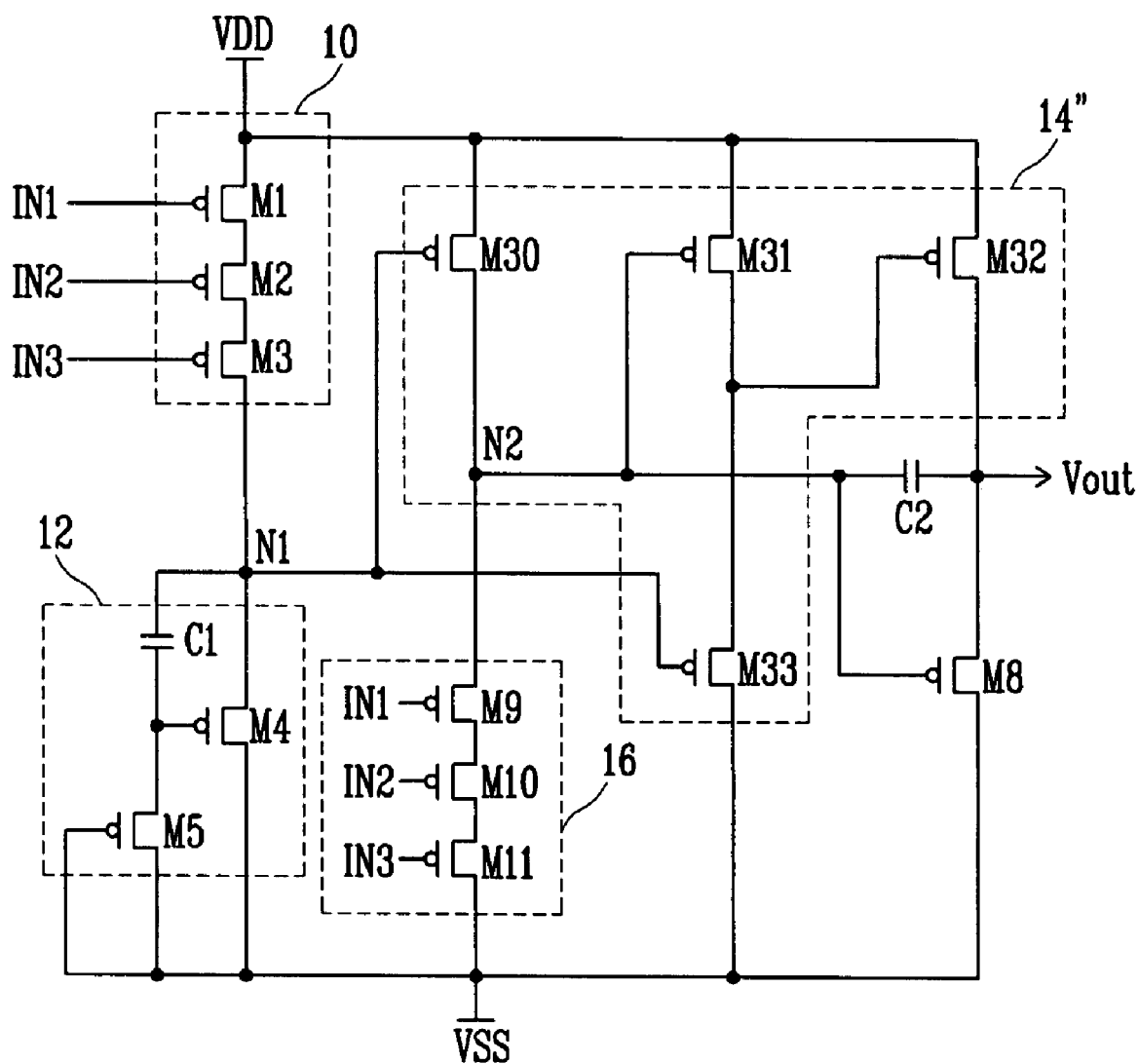
FIG. 4 illustrates a circuit view of an OR gate according to a fourth embodiment of the present invention.

FIG. 4 illustrates a circuit view of an OR gate according to a fourth embodiment of the present invention. The following description will focus on elements that are different from those described above in connection with the first embodiment and, in order to avoid repetition, a detailed explanation of the features described above will not be repeated.

Referring to FIG. 4, the OR gate according to the fourth embodiment of the present invention may include the first driver 10, the second driver 12, a third driver (14"), the fourth driver 16 and the eighth transistor (M8). The first driver 10, the second driver 12 and the fourth driver 16 may be configured and driven in the same manner as described above in connection with FIG. 1.

The third driver (14") may control a voltage supplied to the output terminal (Vout) while controlling whether the eighth transistor (M8) is turned on or turned off in correspondence with a voltage of the first node (N1). The third driver (14") may include a thirtieth transistor (M30) coupled between the fourth driver 16 and the first power source (VDD); a thirty-first transistor (M31) and a thirty-third transistor (M33) coupled between the first power source (VDD) and the second power source (VSS); and a thirty-second transistor (M32) coupled between the output terminal (Vout) and the first power source (VDD).

The thirtieth transistor (M30) may be coupled between the first power source (VDD) and the fourth driver 16, and may be turned on or turned off in correspondence with a voltage of the first node (N1). A voltage of a second node (N2) may be increased to the voltage of the first power source (VDD) when the thirtieth transistor (M30) is turned on. The thirty-first transistor (M31) may control a voltage supplied to a gate electrode of the thirty-second transistor (M32), and may be turned on or turned off in correspondence with a voltage of the second node (N2). The thirty-third transistor (M33) may control a voltage supplied to the gate electrode of the thirty-second transistor (M32), and may be turned on or turned off in correspondence with a voltage of the first node (N1).

The gate electrode of the thirty-second transistor (M32) may be coupled to a second electrode of the thirty-first transistor (M31) and a first electrode of the thirty-third transistor (M33). The thirty-second transistor (M32) may control the connection of the output terminal (Vout) to the first power source (VDD), and may be turned on or turned off in correspondence with a voltage supplied to its gate electrode.

The gate electrode of the eighth transistor (M8) may be coupled to the second node (N2). The eighth transistor (M8) may control an output voltage of the output terminal (Vout) in correspondence with a voltage of the second node (N2).

An operation of the OR gate will be described in detail with reference to FIG. 4 and Table 1.

Any one of the first transistor (M1), the second transistor (M2) and the third transistor (M3) may be turned off when a corresponding one of the first input signal (IN1), the second input signal (IN2) and the third input signal (IN3) is at a HIGH polarity. Any one of the ninth transistor (M9), the tenth transistor (M10) and the eleventh transistor (M11) may be turned off when a corresponding one of the first input signal (IN1), the second input signal (IN2) and the third input signal (IN3) is at a HIGH polarity.

When any one of the first transistor (M1), the second transistor (M2) and the third transistor (M3) is turned off, a voltage of the first node (N1) may be at a LOW polarity. When the voltage of the first node (N1) is at a LOW polarity, the thirtieth transistor (M30) and the thirty-third transistor (M33) may be turned on. When the thirtieth transistor (M30) is turned on, a voltage of the second node (N2) may be set to the first power source (VDD).

When the voltage of the second node (N2) is set to the first power source (VDD), the thirty-first transistor (M31) and the eighth transistor (M8) may be turned off. In this case, the voltage of the second power source (VSS) may be supplied to a gate electrode of the thirty-second transistor (M32) through the turned-on thirty-third transistor (M33), and therefore the thirty-second transistor (M32) may be turned on. The voltage of the first power source (VDD) may be supplied to the output terminal (Vout) when the thirty-second transistor (M32) is turned on.

The first transistor (M1), the second transistor (M2) and the third transistor (M3) may be turned on when the first input signal (IN1), the second input signal (IN2) and the third input signal (IN3) are at a LOW polarity. The ninth transistor (M9), the tenth transistor (M10) and the eleventh transistor (M11)

may be turned on when the first input signal (IN1), the second input signal (IN2) and the third input signal (IN3) are respectively at a LOW polarity.

When the first transistor (M1), the second transistor (M2) and the third transistor (M3) are each turned on, a voltage of the first node (N1) may be set to a HIGH polarity. When the voltage of the first node (N1) is set to the HIGH polarity, the thirtieth transistor (M30) and the thirty-third transistor (M33) may be turned off. In this case, a voltage of the second node (N2) may be set to the voltage of the second power source (VSS).

When the voltage of the second node (N2) is set to the voltage of the second power source (VSS), the thirty-first transistor (M31) and the eighth transistor (M8) may be turned on. When the thirty-first transistor (M31) is turned on, the voltage of the first power source (VDD) may be supplied to the gate electrode of the thirty-second transistor (M32) and the thirty-second transistor (M32) may be turned off. In this case, the voltage of the second power source (VSS) may be supplied to the output terminal (Vout) through the turned-on eighth transistor (M8).

Figure 5:
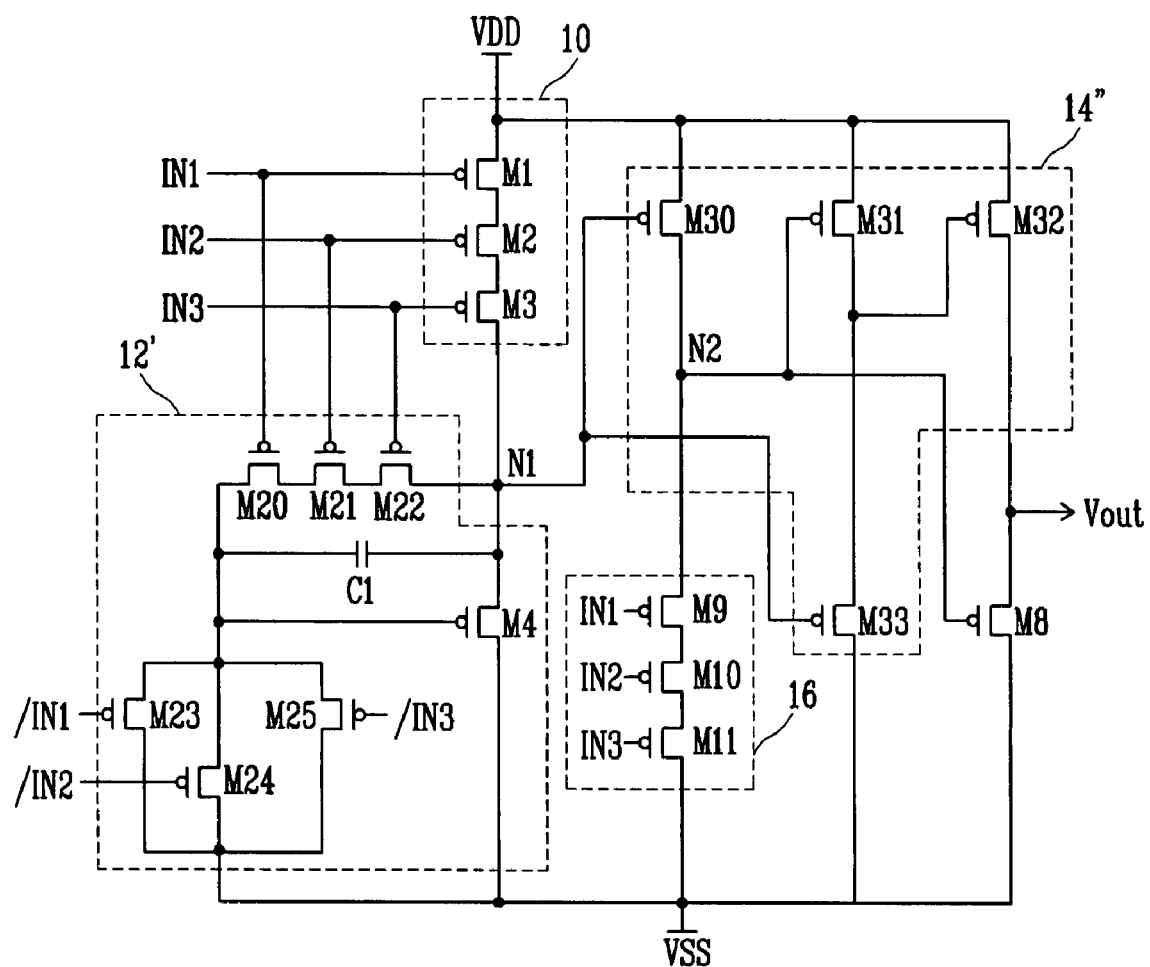
FIG. 5 illustrates a circuit view of an OR gate according to a fifth embodiment of the present invention.

FIG. 5 illustrates a circuit view of an OR gate according to a fifth embodiment of the present invention. The following description will focus on elements that are different from those described above in connection with the first embodiment and, in order to avoid repetition, a detailed explanation of the features described above will not be repeated.

Referring to FIG. 5, the OR gate according to the fifth embodiment of the present invention may include the first driver 10, the second driver (12'), the third driver (14"), the fourth driver 16 and the eighth transistor (M8). The first driver 10 and the fourth driver 16 may be configured in the same manner as in the OR gate described above in connection with FIG. 1, the second driver (12') may be configured in the same manner as the OR gate described above in connection with FIG. 3, and the third driver (14") may be configured in the same manner as the OR gate described above in connection with FIG. 4.

An operation of the OR gate will be described in detail with reference to FIG. 5 and Table 1.

Any of the first transistor (M1), the second transistor (M2) and the third transistor (M3) may be turned off when a corresponding one of the first input signal (IN1), the second input signal (IN2) and the third input signal (IN3) is at a HIGH polarity. Any one of the twentieth transistor (M20), the twenty-first transistor (M21) and the twenty-second transistor (M22) may be turned off when a corresponding one of the first input signal (IN1), the second input signal (IN2) and the third input signal (IN3) is at a HIGH polarity.

When any one of the first input bar signal (/IN1), the second input bar signal (/IN2) and the third input bar signal (/IN3) is at a LOW polarity, the corresponding one of the twenty-third transistor (M23), the twenty-fourth transistor (M24) and the twenty-fifth transistor (M25) may be turned on, and thus the fourth transistor (M4) may be turned on by a voltage at a LOW polarity supplied to its gate electrode. When the fourth transistor (M4) is turned on, a voltage at a LOW polarity may be supplied to the first node (N1).

When the voltage of the first node (N1) is at a LOW polarity, the thirtieth transistor (M30) and the thirty-third transistor (M33) may be turned on. When the thirtieth transistor (M30) is turned on, a voltage of the second node (N2) may be set to the voltage of the first power source (VDD). When the voltage of the second node (N2) is set to the voltage of the first power source (VDD), the thirty-first transistor (M31) and the eighth transistor (M8) may be turned off. In this case, the voltage of the second power source (VSS) may be supplied to the gate electrode of the thirty-second transistor (M32) through the turned-on thirty-third transistor (M33). Thus, the thirty-second transistor (M32) may be turned on and the voltage of the first power source (VDD) may be supplied to the output terminal (Vout) by the thirty-second transistor (M32).

Any one of the first transistor (M1), the second transistor (M2) and the third transistor (M3) may be turned on when a corresponding one of the first input signal (IN1), the second input signal (IN2) and the third input signal (IN3) is at a LOW polarity. Any one of the twentieth transistor (M20), the twenty-first transistor (M21) and the twenty-second transistor (M22) may be turned on when a corresponding one of the first input signal (IN1), the second input signal (IN2) and the third input signal (IN3) is at a LOW polarity. A voltage of the first node (N1) may be at a HIGH polarity and the fourth transistor (M4) may be turned off.

The twenty-third transistor (M23) to the twenty-fifth transistor (M25) may each be turned off when each of the first input bar signal (/IN1) to the third input bar signal (/IN3) has a HIGH polarity, i.e., when the first input signal (IN1), the second input signal (IN2) and the third input signal (IN3) have a LOW polarity. Accordingly, the turned-off state of the fourth transistor (M4) may be maintained stably.

The thirtieth transistor (M30) and the thirty-third transistor (M33) may be turned off when the voltage of the first node (N1) is at a HIGH polarity. In this case, a voltage of the second node (N2) may be set to the voltage of second power source (VSS). When the voltage of the second node (N2) is set to the voltage of the second power source (VSS), the thirty-first transistor (M31) and the eighth transistor (M8) may be turned on. When the thirty-first transistor (M31) is turned on, the voltage of the first power source (VDD) may be supplied to the gate electrode of the thirty-second transistor (M32), and therefore the thirty-second transistor (M32) may be turned off. In this case, the voltage of the second power source (VSS) may be supplied to the output terminal (Vout) through the turned-on eighth transistor (M8).

Figure 6:
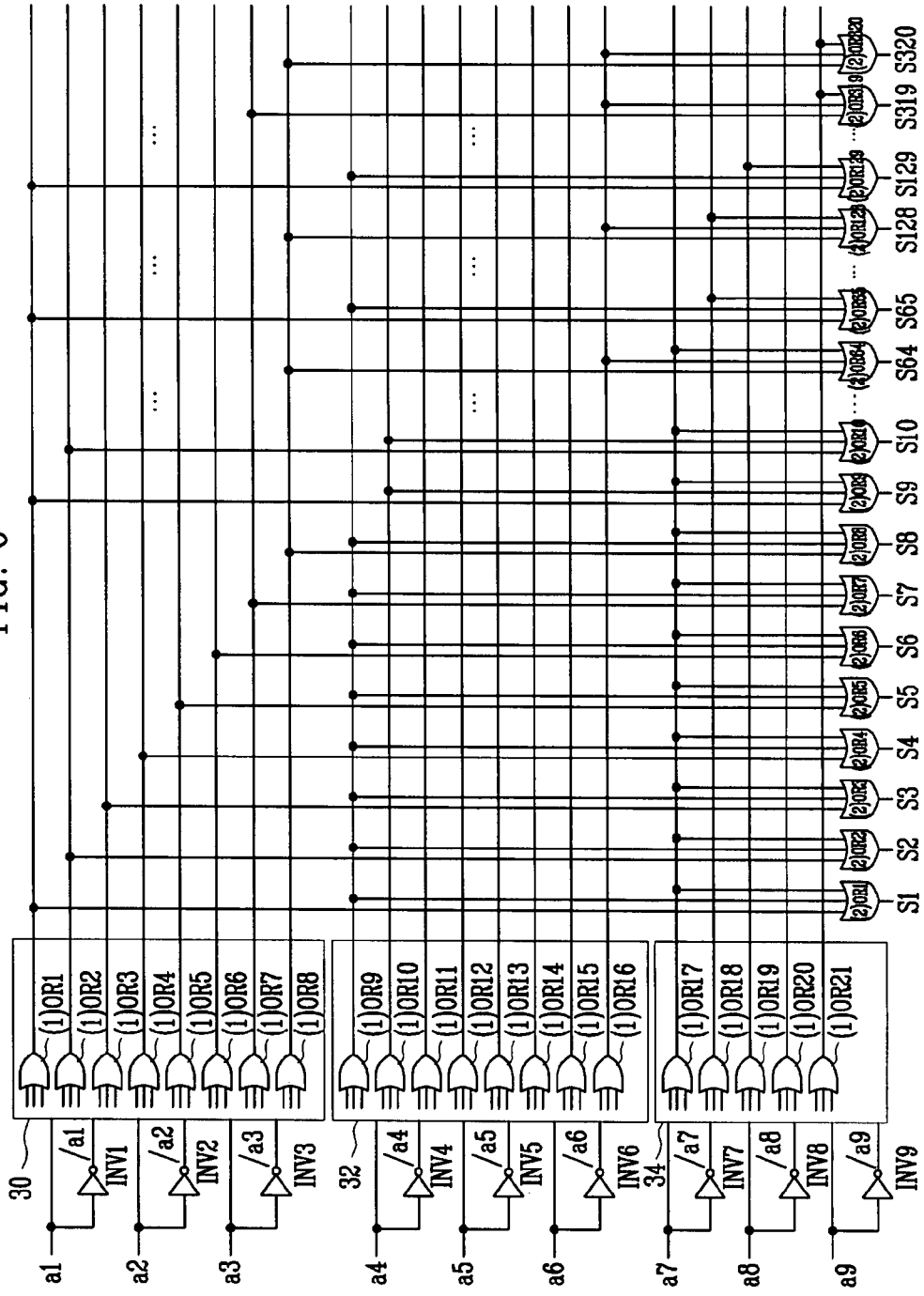
FIG. 6 illustrates a circuit view of a scan driver according to an embodiment of the present invention.

FIG. 6 illustrates a circuit view of a scan driver according to an embodiment of the present invention. The scan driver may be realized using any of the OR gates described above in connection with FIGS. 1 to 5. For convenience of description, the scan driver will be described as being coupled to 320 scan lines (S1 to S320), with scan signals sequentially supplied to the scan lines (S1 to S320).

Referring to FIG. 6, the scan driver may include a plurality of decoders, e.g., decoders 30, 32, 34, which may each have a plurality of first OR gates. The scan driver may further include a plurality of second OR gates ((2)OR1 to (2)OR320) for performing an OR operation on outputs of the decoders 30, 32, 34 to generate scan signals.

The first decoder 30 and the second decoder 32 may each include three input terminals and eight output terminals. The first decoder 30 and the second decoder 32 may each include eight first OR gates ((1)OR1 to (1)OR8, and (1)OR9 to (1)OR16, respectively). The third decoder 34 may include three input terminals and five output terminals. The third decoder 34 may include five first OR gates ((1)OR17 to (1)OR21). Thus, the three decoders may provide a total of 320 scan signals (8×8×5).

It will be appreciated that the number of the first OR gates included in each of the decoders 30, 32, 34 may be determined depending on the number of the scan lines (S1 to S320) coupled to the scan driver. For example, twenty-one first OR gates may be provided, so as to supply a scan signal to the 320 scan lines (S1 to S320), as shown in FIG. 6.

The first decoder 30 may supply input signals that are input to a first input terminal (a1), a second input terminal (a2), and a third input terminal (a3) to the first OR gates ((1)OR1 to (1)OR8). In an embodiment of the present invention, respective input bar signals may be generated by inverters (INV1, INV2, INV3) coupled to each of the input terminals (a1, a2, s3).

The second decoder 32 may supply input signals that are input to a fourth input terminal (a4), a fifth input terminal (a5), and a sixth input terminal (a6) to the first OR gates ((1)OR9 to (1)OR16). In an embodiment of the present invention, respective input bar signals may be generated by inverters (INV4, INV5, INV6) coupled to each of the input terminals (a4, a5, s6).

The third decoder 34 may supply input signals that are input to a seventh input terminal (a7), an eighth input terminal (a8), and a ninth input terminal (a9) to the first OR gates ((1)OR17 to (1)OR21). In an embodiment of the present invention, respective input bar signals may be generated by inverters (INV7, INV8, INV9) coupled to each of the input terminals (a7, a8, s9).

Each of the second OR gates ((2)OR1 to (2)OR320) may receive three input signals, i.e., a signal output from each of the first decoder 30, the second decoder 32 and the third decoder 34, and may supply signals to the scan lines (S1 to S320) by performing an OR operation on the three received signals. That is, OR gates that are used as the second OR gates may receive input signals that are output from the terminals Vout of the first OR gates. The second OR gates may provide scan signals via their respective terminals Vout. In an implementation, the first and second power sources (VDD) and (VSS) provided to the first OR gates may be the same as those provided to the second OR gates, although separate power sources may be respectively provided to the second OR gates. Although not illustrated in FIG. 6, the OR gates may include an inverter. The input bar signals output from the inverters may be provided to the OR gates.

In detail, the $1^{st}$ second OR gate ((2)OR1) may supply a scan signal to the first scan line (S1) by performing an OR operation on outputs of the $1^{st}$ first OR gate ((1)OR1), the $9^{th}$ first OR gate ((1)OR9) and the $17^{th}$ first OR gate ((1)OR17). Further, the $2^{nd}$ second OR gate ((2)OR2) may supply a scan signal to the second scan line (S2) by performing an OR operation on outputs of the $2^{nd}$ first OR gate ((1)OR2), the $9^{th}$ first OR gate ((1)OR9) and the $17^{th}$ first OR gate ((1)OR17).

Similarly, the $64^{th}$ second OR gate ((2)OR64) may supply a scan signal to the sixty-fourth scan line (S64) by performing an OR operation on outputs of the $8^{th}$ first OR gate ((1)OR8), the $16^{th}$ first OR gate ((1)OR16) and the $17^{th}$ first OR gate ((1)OR17).

Similarly, the $320^{th}$ second OR gate ((2)OR320) may supply a scan signal to the three hundred-twentieth scan line (S320) by performing an OR operation on outputs of the $8^{th}$ first OR gate ((1)OR8), the $16^{th}$ first OR gate ((1)OR16) and the $21^{st}$ first OR gate ((1)OR21).

As described above, in a scan driver according to this embodiment of the present invention, each of the second OR gates ((2)OR1 to (2)OR320) may supply a scan signal to respective scan lines (S1 to S320) by performing an OR operation on outputs of the decoders 30, 32, 34.

Figure 7:
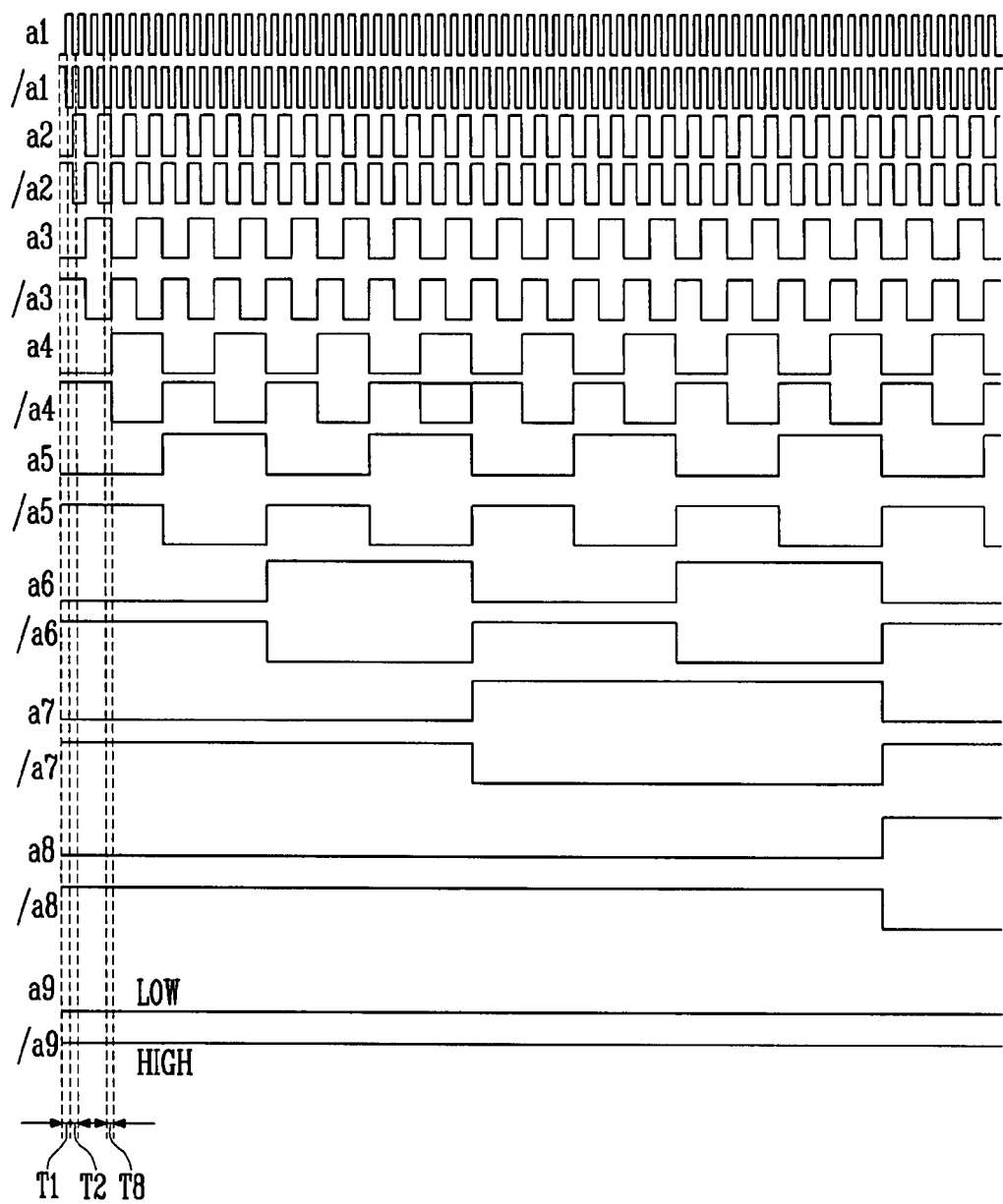
FIG. 7 illustrates driving waveforms according to an embodiment of the present invention.

FIG. 7 illustrates driving waveforms according to an embodiment of the present invention. The driving waveforms may be supplied to input terminals and input bar terminals of the scan driver shown in FIG. 6. Referring to FIG. 7, driving waveforms having different frequencies may be supplied to the input terminals (a1 to a9) of the scan driver. In an implementation, the frequencies of the driving waveforms may double with each increment from the ninth input terminal (a9) to first input terminal (a1). For example, the frequency of the driving waveform supplied to the eighth input terminal (a8) may be twice the frequency of the driving waveform supplied to the ninth input terminal (a9), the frequency of the driving waveform supplied to the seventh input terminal (a7) may be twice the frequency of the driving waveform supplied to the eighth input terminal (a8), the frequency of the driving waveform supplied to the sixth input terminal (a6) may be twice the frequency of the driving waveform supplied to the seventh input terminal (a7), etc. In an embodiment of the present invention, driving waveforms supplied to input bar terminals (/a1 to /a9) may be generated by an inverter coupled to each of the input terminals (a1 to a9). Alternatively, the driving waveforms input to the input bar terminals may be externally provided.

In an implementation (not shown), parasitic capacitance, resistance and signal delays of wiring lines in the scan driver may be reduced using a layout in which the decoders 30, 32, 34 are positioned according to the frequencies of the waveforms applied thereto. For example, the decoder receiving higher frequencies may be positioned nearer the second OR gates ((2)OR1 to (2)OR320). Such an arrangement may improve response time.

Figure 8:
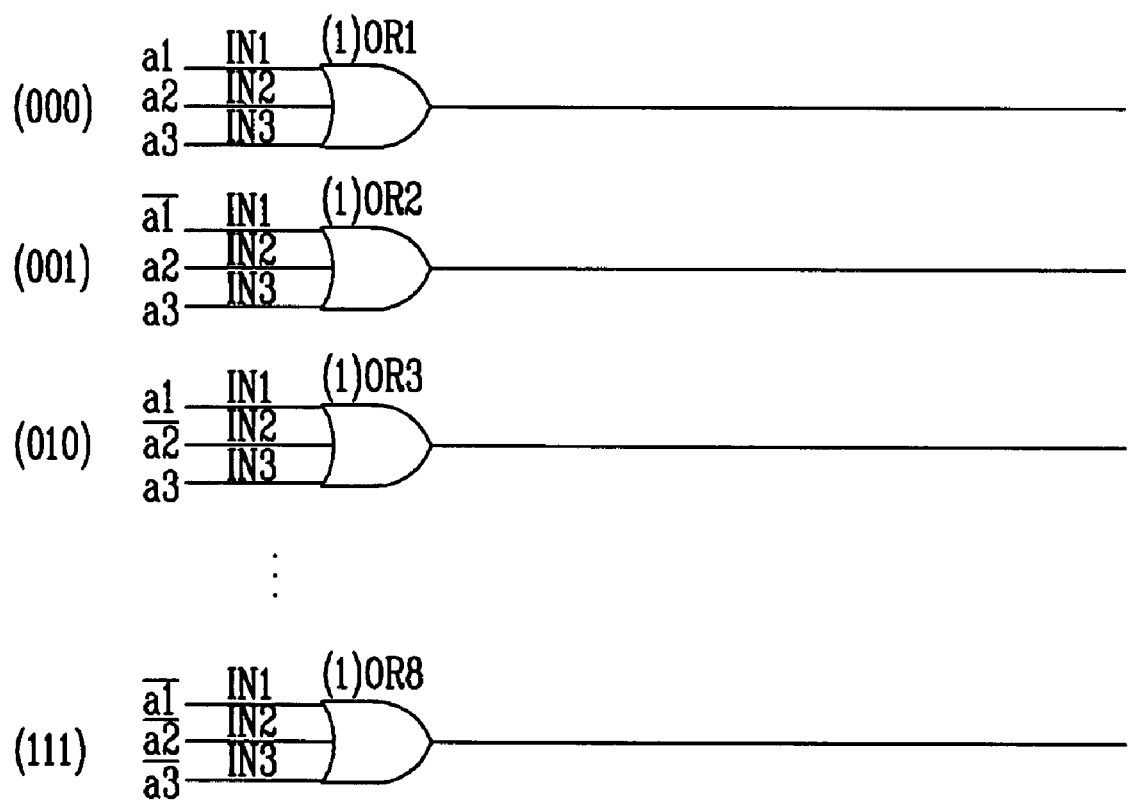
FIG. 8 illustrates a schematic view of connections of the first OR gates shown in FIG. 6.
Figure 9A:
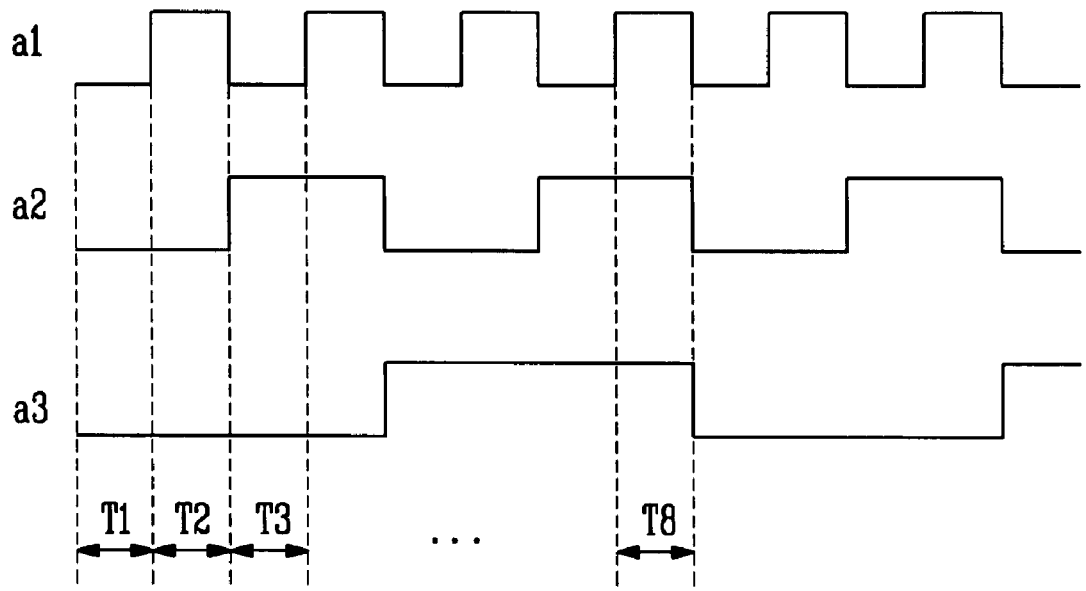
FIG. 9A illustrates a detailed view of driving waveforms according to an embodiment of the present invention.

FIG. 8 illustrates a schematic view of connections of the first OR gates shown in FIG. 6, and FIG. 9A illustrates a detailed view of driving waveforms according to an embodiment of the present invention. The driving waveforms may be supplied to the first input terminal (a1), the second input terminal (a2) and the third input terminal (a3) of the scan driver shown in FIG. 6. In an embodiment of the present invention, the driving waveforms may also be input to the first input bar terminal (/a1), the second input bar terminal (/a2) and the third input bar terminal (/a3), which may each be provided with an inverter.

For convenience of description, only a configuration of connections of the first OR gates ((1)OR1, (1)OR2), (1)OR3, . . . , (1)OR8) of the first decoder 30 is shown in FIG. 8. It will be appreciated that the configuration of connections of the first OR gates ((1)OR9 to (1)OR21) of the second and third decoders 32, 34 may be similarly designed using the appropriate input terminals. Thus, a $9^{th}$ first OR gate ((1)OR9) may be coupled to the fourth input terminal (a4) through the sixth input terminal (a6), just as the $1^{st}$ first OR gate ((1)OR1) may be coupled to the first input terminal (a1) through the third input terminal (a3), as shown in FIG. 8. Similarly, the $17^{th}$ first OR gate ((1)OR17) may be coupled to the seventh input terminal (a7) through the ninth input terminal (a9).

Referring to FIGS. 8 and 9A, in order to sequentially output scan signals, the $1^{st}$ first OR gate ((1)OR1) to the $8^{th}$ first OR gate ((1)OR8) may sequentially output signals having a LOW polarity.

The $1^{st}$ first OR gate ((1)OR1) may receive input signals (IN1)-(IN3) from respective input terminals (a1)-(a3) of the decoder, and may receive input bar signals (/IN1)-(/IN3) from respective input bar terminals (/a1)-(/a3) of the decoder. In operation, during a first period (T1), the $1^{st}$ first OR gate ((1)OR1) may receive the first input signal (IN1) having a LOW polarity from the first input terminal (a1), receive the second input signal (IN2) having a LOW polarity from the second input terminal (a2), and receive the third input signal (IN3) having a LOW polarity from the third input terminal (a3). The $1^{st}$ first OR gate ((1)OR1) may thus output a voltage at a LOW polarity during the first period (T1).

The $9^{th}$ first OR gate ((1)OR9) may also receive input signals (IN1)-(IN3) from respective input terminals (a1)-(a3) of the decoder, and may receive input bar signals (/IN1)-(/IN3) from respective input bar terminals (/a1)-(/a3) of the decoder. Thus, the $9^{th}$ first OR gate ((1)OR9) may receive a voltage having a LOW polarity from each of the fourth input terminal (a4), the fifth input terminal (a5), and the sixth input terminal (a6) during the first period (T1), and may output a voltage having a LOW polarity.

The $17^{th}$ first OR gate ((1)OR17) may also receive input signals (IN1)-(IN3) from respective input terminals (a1)-(a3)

of the decoder, and may receive input bar signals (/IN1)-(/IN3) from respective input bar terminals (/a1)-(/a3) of the decoder. Thus, the 17$^{th}$ first OR gate ((1)OR17) may receive a voltage having a LOW polarity from each of the seventh input terminal (a7), the eighth input terminal (a8), and the ninth input terminal (a9) during the first period (T1), and may output a voltage at the LOW polarity. Thus, a scan signal may be output to the first scan line (S1) during the first period (T1), i.e., a voltage having a LOW polarity may be output from the 1$^{st}$ second OR gate ((2)OR1), which is coupled to each of the 1$^{st}$ first OR gate ((1)OR1), the 9th first OR gate ((1)OR9) and the 17$^{th}$ first OR gate ((1)OR17), and which receives respective LOW polarity voltages therefrom during the first period (T1).

At the start of a second period (T2), the driving waveform applied to the first input terminal (a1) and the input bar terminal (/a1) may transition to a HIGH polarity, as shown in FIG. 9A. However, referring to FIG. 7, the driving waveforms applied to the remaining input terminals (a2 to a9 and /a2 to /a9) may not transition.

The 2$^{nd}$ first OR gate ((1)OR2) may receive the input signal (IN1) from the input bar terminal (/a1) of the decoder, receive the input signals (IN2) and (IN3) from respective input terminals (a2) and (a3) of the decoder, receive the input bar signal (/IN1) from the input terminal (a1) of the decoder, and receive the input bar signals (/IN2) and (/IN3) from respective input bar terminals (/a2) and (/a3) of the decoder. Thus, during the second period (T2) the 2$^{nd}$ first OR gate ((1)OR2) may receive a first input signal (IN1) from the first input bar terminal (/a1), i.e., it may receive a LOW polarity signal. The 2$^{nd}$ first OR gate ((1)OR2) may receive the second input signal (IN2) from the second input terminal (a2) and may receive the third input signal (IN3) from the third input terminal (a3). The 2$^{nd}$ first OR gate ((1)OR2) may thus output a voltage having a LOW polarity during the second period (T2). The 9$^{th}$ first OR gate ((1)OR9) and the 17$^{th}$ first OR gate ((1)OR17) may output voltages at a LOW polarity during the second period (T2). Accordingly, a scan signal may be output to the second scan line (S2) during the second period (T2), i.e., a voltage at a LOW polarity may be output from the 2$^{nd}$ second OR gate ((2)OR2), which is coupled to each of the 2$^{nd}$ first OR gate ((1)OR2), the 9$^{th}$ first OR gate ((1)OR9), and the 17$^{th}$ first OR gate ((1)OR17), and which receives respective LOW polarity voltages therefrom during the second period (T2).

The 8$^{th}$ first OR gate ((1)OR8) may receive the driving signal supplied from the first input bar terminal (/a1) as the first input signal (IN1), receive the driving signal supplied from the second input bar terminal (/a2) as the second input signal (IN2), and receive the driving signal supplied from the third input bar terminal (/a3) as the third input signal (IN3), and may similarly receive the input bar signals (/IN1) to (/IN3) from the respective input terminals (a1) to (a3). Accordingly, during an eighth period (T8) shown in FIGS. 7 and 9A, a voltage at a LOW polarity may be output from the 8$^{th}$ first OR gate ((1)OR8) during the eighth period (T8).

A voltage at a LOW may be output from the 9$^{th}$ first OR gate ((1)OR9) in response to a voltage at a LOW polarity being supplied to the fourth input terminal (a4), the fifth input terminal (a5) and the sixth input terminal (a6) during the eighth period (T8). Additionally, a voltage at a LOW polarity may be output from the 17$^{th}$ first OR gate ((1)OR17) in response to a voltage at a LOW polarity being supplied to the seventh input terminal (a7), the eighth input terminal (a8) and the ninth input terminal (a9) during the eighth period (T8). Thus, during the eighth period (T8), a voltage at a LOW polarity, i.e., a scan signal, may be output to the eighth scan line (S8) by the 8$^{th}$ second OR gate ((2)OR8), which is coupled to the 8$^{th}$ first OR gate ((1)OR8), the 9$^{th}$ first OR gate ((1)OR9), and the 17$^{th}$ first OR gate ((1)OR17).

As described above, the scan driver according to this embodiment of the present invention may sequentially supply a scan signal to the scan lines (S1 to S320). The scan driver may include OR gates in which all the transistors are PMOS transistors. Thus, the scan driver may be formed in a panel of the organic light emitting diode display.

An exemplary connection configuration in which the scan signals are sequentially supplied to the scan lines (S1 to S320) has been described above, but embodiments of the present invention are not limited thereto. For example, a scan driver according to another embodiment of the present invention may be configured to drive a display, e.g., an organic light emitting diode display, in a digital mode. In the digital mode, the display may reproduce a predetermined image by supplying a data signal of "1" or "0" and controlling an emission time of each of the pixels. However, contour noise, etc., may be generated where such a digital mode display is driven using subframe units. Therefore, it may be desirable to supply a scan signal to the lines without sequentially supplying the scan signal. It will be appreciated that a scan driver according to an embodiment of the present invention be implemented to supply non-sequential scan signals, and may supply a scan signal to any of the scan lines by changing the driving waveform shown in FIG. 7 and/or the connection configuration shown in FIG. 6.

For example, a non-emission time may be reduced to reduce or eliminate contour noise using an approach in which a scan signal is supplied to the tenth scan line (S10), followed by the sixtieth scan line (S60). The 1$^{st}$ second OR gate ((2)OR1) may be coupled to the tenth scan line (S1), and the 2$^{nd}$ second OR gate ((2)OR2) may be coupled to the sixtieth scan line (S60). Therefore, the scan signal may be supplied to the tenth scan line (S10), then to the sixtieth scan line (S60). Thus, a scan signal may be supplied to a predetermined point by changing connection positions of the second OR gates ((2)OR1 to (2)OR320). Accordingly, a scan driver according to an embodiment of the present invention may provide a scan signal suitable for digitally driving a display.

Figure 9B:
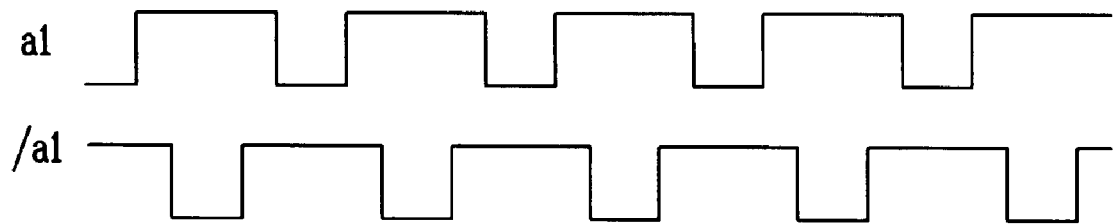
FIG. 9B illustrates driving waveforms according to another embodiment of the present invention.

FIG. 9B illustrates driving waveforms according to another embodiment of the present invention. As shown in FIG. 9B, a period during which the waveform is at a HIGH polarity may be greater than a period during which the waveform is at a LOW polarity. Such a waveform may be used for each of the terminals (a1 to a9, /a1 to /a9) that are illustrated in FIG. 7.

As a particular example, the HIGH polarity may be set to a longer period than that of the LOW polarity in the driving waveform supplied to the first input terminal (a1). Further, the HIGH polarity may be set to a longer period than that of the LOW polarity in the driving waveform supplied to the first input bar terminal (/a1). It will be appreciated that, in this case, the driving waveform supplied to the first input bar terminal (/a1) may not be generated using the above-described inverters, and may instead be externally provided. If the period of the HIGH polarity is set to be longer than that of the LOW polarity in the driving waveform, then the LOW period may be prevented from overlapping with the HIGH polarity due to delay, etc., and therefore a more stable driving arrangement may be provided.

Figure 10:
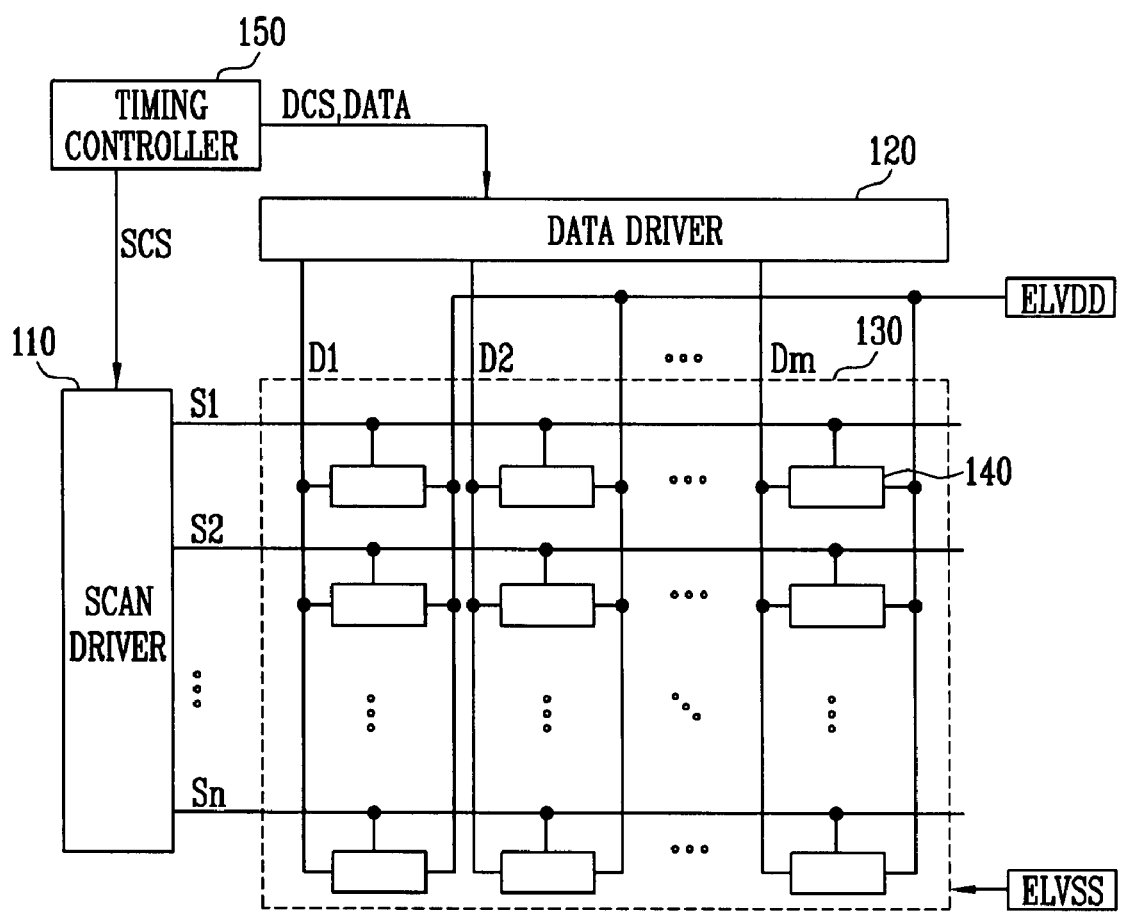
FIG. 10 illustrates a schematic view of an organic light emitting diode display according to an embodiment of the present invention.

FIG. 10 illustrates a schematic view of an organic light emitting diode display according to an embodiment of the present invention. Referring to FIG. 10, the organic light emitting diode display may include a pixel unit 130 including pixels 140 formed in an intersection region of scan lines (S1 to Sn) and data lines (D1 to Dm); a scan driver 110 for driving the scan lines (S1 to Sn); a data driver 120 for driving the data lines (D1 to Dm); and a timing controller 150 for controlling the scan driver 110 and the data driver 120.

The data driver 120 may generate data signals in response to a data driving control signal (DCS) supplied from a timing controller 150, and may provide the generated data signals to the data lines (D1 to Dm). The data driver 120 may supply the data signals, corresponding to one line, to the data lines (D1 to Dm) in every horizontal period (1H).

The scan driver 110 may generate scan signals in response to a scan driving control signal (SCS) (for example, a signal having waveform similar to a driving waveform shown in FIG. 7) supplied from the timing controller 150, and may supply the generated scan signals to the scan lines (S1 to Sn). The scan signals generated in the scan driver 110 may be sequentially supplied to the scan lines (S1 to Sn), or may be supplied in another order. As described above, the scan driver 110 may include OR gates having transistors that are all PMOS transistor, and may be formed in a panel of the display.

In another implementation, in order to reduce a mounting area of a panel, decoders 30, 32, 34 for the scan driver 110 may be formed on the data driver 120, e.g., in the form of a chip, or integrated circuit. Thus, the data driver 120 may be formed to include the decoders 30, 32, 34 in the data driver 120 chip. The scan driver 110 may be stably driven by electrically connecting the decoders 30, 32, 34 to second OR gates formed in a panel of the display, e.g., in a panel that includes pixel circuits.

The timing controller 150 may generate a data driving control signal (DCS) and a scan driving control signal (SCS) in correspondence with externally provided synchronizing signals. The data driving control signals (DCS) generated by the timing controller 150 may be supplied to the data driver 120, and the scan driving control signals (SCS) may be supplied to the scan driver 110. The timing controller 150 may rearrange externally provided data and supply the data to the data driver 120.

The pixel unit 130 may receive power from a first driving power source (ELVDD) and a second driving power source (ELVSS), which may be externally provided, and may supply the first driving power source (ELVDD) and the second driving power source (ELVSS) to each of the pixels 140. The pixels 140 may receive the first driving power source (ELVDD) and the second driving power source (ELVSS) in correspondence with a data signal, and may control an electric current flowing from the first driving power source (ELVDD) to the second driving power source (ELVSS) via an organic light emitting diode. Each of the pixels 140 may include one or more transistors. In an embodiment of the present invention, all of the transistors included in the pixels 140 and all of the transistors included in the scan driver 110 may be a same type of transistor, e.g., PMOS transistors.

As described above, a logic gate according to an embodiment of the present invention may be used for a scan driver in which OR logic gate transistors are all a same type of MOS transistor, e.g., all PMOS transistors. Thus, the scan driver may be formed in a panel without increasing of the number of masks, since all of the transistors in the scan driver may be a same type as transistors used in pixel circuits, e.g., PMOS transistors. Further, where the scan driver forms part of a display that includes pixel circuits having PMOS transistors, the OR gate PMOS transistors may be formed at the same time as the pixel circuit PMOS transistors. Therefore, manufacturing costs may be reduced. A scan driver according to an embodiment of the present invention may be configured to provide a particular order of scan signals to the scan lines by varying the driving waveforms and/or the OR gates. Accordingly, the scan driver may be suitable for various driving arrangements.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A logic gate, comprising:
a first driver configured to receive at least one input signal, and configured to control a connection between a first power source and a first node of the logic gate in correspondence with the at least one input signal;
a second driver coupled to the first node and a second power source, and configured to control a voltage of the first node;
a third driver configured to control a connection between an output terminal and the first power source in correspondence with the voltage of the first node;
a control transistor configured to control a connection between the third driver and the second power source;
a fourth driver configured to control a connection between a gate electrode of the control transistor and the second power source; and
a second capacitor coupled between a first electrode of the control transistor and the gate electrode of the control transistor, wherein:
the control transistor and all transistors in the first driver, the second driver, the third driver and the fourth driver are a same type of MOS transistor,
the first driver includes a plurality of transistors coupled in series between the first power source and the first node, the transistors being configured to operate in correspondence with a plurality of input signals, and
the first driver includes:
a first transistor configured to operate in correspondence with a first input signal;
a second transistor configured to operate in correspondence with a second input signal; and
a third transistor configured to operate in correspondence with a third input signal.

2. The logic gate as claimed in claim 1, wherein the control transistor and all the transistors in the first driver, the second driver, the third driver, and the fourth driver are PMOS transistors.

3. The logic gate as claimed in claim 1, wherein:
the second driver is configured to maintain the first node at a voltage of the first power source when the first driver connects the first power source to the first node, and
the second driver is configured to maintain the first node at a voltage of the second power source at other times.

4. The logic gate as claimed in claim 3, wherein the second driver includes:
a fourth transistor configured to control a connection between the first node and the second power source;
a fifth transistor having a first electrode coupled to a gate electrode of the fourth transistor, and having a second electrode and gate electrode coupled to the second power source; and
a first capacitor coupled between a first electrode and the gate electrode of the fourth transistor.

5. The logic gate as claimed in claim 4, wherein a length/width ratio of the fourth transistor is set to a narrower range than that of the first transistor, the second transistor, and the third transistor.

6. The logic gate as claimed in claim 3, wherein the second driver includes:
a fourth transistor configured to control a connection between the first node and the second power source;
a first capacitor coupled between a first electrode and a gate electrode of the fourth transistor;

a twentieth transistor, a twenty-first transistor and a twenty-second transistor, wherein the twentieth, twenty-first, and twenty-second transistors are coupled in series between the first electrode and the gate electrode of the fourth transistor, and are configured to operate in correspondence with a plurality of input signals; and a twenty-third transistor, a twenty-fourth transistor and a twenty-fifth transistor, wherein the twenty-third, twenty-fourth, and twenty-fifth transistors are coupled in parallel between the gate electrode of the fourth transistor and the second power source, and are configured to operate in correspondence with a plurality of input bar signals.

7. The logic gate as claimed in claim 1, wherein the third driver includes a sixth transistor configured to control a connection between the first power source and the first electrode of the control transistor in correspondence with the voltage of the first node.

8. The logic gate as claimed in claim 7, wherein the third driver further includes a seventh transistor configured to control a connection between the first electrode and the gate electrode of the control transistor in correspondence with the voltage of the first node.

9. The logic gate as claimed in claim 1, wherein:
the fourth driver includes a plurality of transistors coupled in series between the gate electrode of the control transistor and the second power source, and
the transistors are configured to operate in correspondence with a plurality of input signals.

10. The logic gate as claimed in claim 9, wherein the fourth driver includes:
a ninth transistor configured to operate in correspondence with a first input signal;
a tenth transistor configured to operate in correspondence with a second input signal; and
an eleventh transistor configured to operate in correspondence with a third input signal.

11. A logic gate, comprising:
a first driver configured to receive at least one input signal, and configured to control a connection between a first power source and a first node of the logic gate in correspondence with the at least one input signal;
a second driver coupled to the first node and a second power source, and configured to control a voltage of the first node;
a third driver configured to control a connection between an output terminal and the first power source in correspondence with the voltage of the first node;
a control transistor configured to control a connection between the third driver and the second power source;
a fourth driver configured to control a connection between a gate electrode of the control transistor and the second power source; and
a second capacitor coupled between a first electrode of the control transistor and the gate electrode of the control transistor, wherein:
the control transistor and all transistors in the first driver, the second driver, the third driver and the fourth driver are a same type of MOS transistor, and
the third driver includes:
a thirtieth transistor, a thirty-first transistor, a thirty-second transistor, and a thirty-third transistor,
the thirtieth transistor is configured to control a connection between the first power source and the fourth driver in correspondence with the voltage of the first node, the thirty-first transistor is configured to control a connection between the first power source and the thirty-third transistor, and has a gate electrode coupled to a second electrode of the thirtieth transistor,
the thirty-third transistor is configured to control a connection between the thirty-first transistor and the second power source in correspondence with the voltage of the first node, and
the thirty-second transistor is configured to control a connection between the control transistor and the first power source, and has a gate electrode coupled to a second electrode of the thirty-first transistor.

12. The logic gate as claimed in claim 11, wherein the gate electrode of the control transistor is coupled to the second electrode of the thirtieth transistor.

13. A logic gate, comprising:
a first driver configured to receive at least one input signal, and configured to control a connection between a first power source and a first node of the logic gate in correspondence with the at least one input signal;
a second driver coupled to the first node and a second power source, and configured to control a voltage of the first node;
a third driver configured to control a connection between an output terminal and the first power source in correspondence with the voltage of the first node;
a control transistor configured to control a connection between the third driver and the second power source;
a fourth driver configured to control a connection between a gate electrode of the control transistor and the second power source; and
a second capacitor coupled between a first electrode of the control transistor and the gate electrode of the control transistor, wherein:
the control transistor and all transistors in the first driver, the second driver, the third driver and the fourth driver are a same type of MOS transistor, and
the fourth driver includes a ninth transistor having a first electrode coupled to the gate electrode of the control transistor, and having a second electrode and a gate electrode coupled to the second power source.

14. The logic gate as claimed in claim 13, wherein a length/width ratio of the control transistor is set to a narrower range than that of at least one transistor included in the third driver.

15. A scan driver, comprising:
at least one decoder having a plurality of first OR gates configured to provide a plurality of first signals; and
a plurality of second OR gates configured to carry out an OR operation on the first signals and to provide a plurality of scan signals, wherein:
all transistors in each of the first OR gates and the second OR gates are a same type of MOS transistor,
at least one first OR gate or second OR gate includes:
a first driver configured to receive at least one input signal, and configured to control a connection between a first power source and a first node of the logic gate in correspondence with the at least one input signal;
a second driver coupled to the first node and a second power source, and configured to control a voltage of the first node;
a third driver configured to control a connection between an output terminal and the first power source in correspondence with the voltage of the first node;
a control transistor configured to control a connection between the third driver and the second power source;

a fourth driver configured to control a connection between a gate electrode of the control transistor and the second power source; and a second capacitor coupled between a first electrode of the control transistor and the gate electrode of the control transistor, the control transistor and all transistors in the first driver, the second driver, the third driver and the fourth driver are a same type of MOS transistor, the first driver includes a plurality of transistors coupled in series between the first power source and the first node, the transistors being configured to operate in correspondence with a plurality of input signals, and the first driver includes:
 a first transistor configured to operate in correspondence with a first input signal;
 a second transistor configured to operate in correspondence with a second input signal; and
 a third transistor configured to operate in correspondence with a third input signal.

16. The scan driver as claimed in claim 15, wherein all the transistors in each of the first OR gates and the second OR gates are PMOS transistors.

17. The scan driver as claimed in claim 15, wherein:
the at least one decoder is configured to receive at least one externally-supplied signal out of driving signals and driving bar signals, and
the driving signals and driving bar signals are set to a longer period of a HIGH polarity than that of a LOW polarity.

18. An organic light emitting diode display, comprising:
pixel circuits coupled to respective data lines and scan lines;
a data driver configured to supply data signals to the data lines; and
a scan driver configured to provide scan signals to the scan lines, wherein:
the scan driver includes:
 at least one decoder having a plurality of first OR gates configured to provide a plurality of first signals; and
 a plurality of second OR gates configured to carry out an OR operation on the first signals and to provide a plurality of scan signals,
all transistors in each of the first OR gates and the second OR gates are a same type of MOS transistor,
at least one first OR gate or second OR gate includes:
 a first driver configured to receive at least one input signal, and configured to control a connection between a first power source and a first node of the logic gate in correspondence with the at least one input signal;
 a second driver coupled to the first node and a second power source, and configured to control a voltage of the first node;
 a third driver configured to control a connection between an output terminal and the first power source in correspondence with the voltage of the first node;
 a control transistor configured to control a connection between the third driver and the second power source;
 a fourth driver configured to control a connection between a gate electrode of the control transistor and the second power source; and
 a second capacitor coupled between a first electrode of the control transistor and the gate electrode of the control transistor, the control transistor and all transistors in the first driver, the second driver, the third driver and the fourth driver are a same type of MOS transistor, the first driver includes a plurality of transistors coupled in series between the first power source and the first node, the transistors being configured to operate in correspondence with a plurality of input signals, and the first driver includes:
 a first transistor configured to operate in correspondence with a first input signal;
 a second transistor configured to operate in correspondence with a second input signal; and
 a third transistor configured to operate in correspondence with a third input signal.

19. The organic light emitting diode display as claimed in claim 18, wherein:
the pixel circuits each include at least one transistor, and
the second OR gates and the pixel circuits are part of a same panel.

20. The organic light emitting diode display as claimed in claim 19, wherein the first OR gates and the data driver are part of a same chip.

21. The organic light emitting diode display as claimed in claim 18, wherein:
the scan driver includes PMOS transistors, and
the PMOS transistors in the scan driver are formed at the same time as the transistors in the pixel circuits.

22. The organic light emitting diode display as claimed in claim 18, wherein:
the at least one decoder is configured to receive at least one externally-supplied signal out of driving signals and driving bar signals, and
the driving signals and driving bar signals are set to a longer period of a HIGH polarity than that of a LOW polarity.

23. The organic light emitting diode display as claimed in claim 18, wherein:
the second driver is configured to maintain the first node at a voltage of the first power source when the first driver connects the first power source to the first node, and
the second driver is configured to maintain the first node at a voltage of the second power source at other times.

24. The organic light emitting diode display as claimed in claim 18, wherein the third driver is configured to control a connection between the first power source and the first electrode of the control transistor in correspondence with the voltage of the first node.

25. The organic light emitting diode display as claimed in claim 18, wherein:
the fourth driver includes a plurality of transistors coupled between the gate electrode of the control transistor and the second power source, and
the transistors are configured to operate in correspondence with a plurality of input signals.

26. The organic light emitting diode display as claimed in claim 18, wherein:
the display includes a plurality of decoders,
the display is configured to provide a plurality of input signals to the decoders, the input signals having different frequencies, and
a decoder receiving a higher frequency input signal is disposed closer to the second OR gates than a decoder receiving a lower frequency input signal.

* * * * *